United States Patent
Lotfi

(10) Patent No.: US 11,569,800 B2
(45) Date of Patent: Jan. 31, 2023

(54) DETECTION AND CORRECTION OF SINGLE EVENT UPSET (SEU) IN INTEGRATED CIRCUIT

(71) Applicant: CAES Colorado Springs LLC, Colorado Springs, CO (US)

(72) Inventor: Younes Lotfi, Colorado Springs, CO (US)

(73) Assignee: CAES Colorado Springs, LLC, Colorado Springs, CO (US)

( * ) Notice: Subject to any disclaimer, the term of this patent is extended or adjusted under 35 U.S.C. 154(b) by 0 days.

(21) Appl. No.: 17/696,804

(22) Filed: Mar. 16, 2022

(65) Prior Publication Data
US 2022/0209753 A1 Jun. 30, 2022

Related U.S. Application Data

(63) Continuation of application No. 16/560,893, filed on Sep. 4, 2019, now Pat. No. 11,283,431.

(51) Int. Cl.
*H03K 3/037* (2006.01)
*G01R 31/3177* (2006.01)

(52) U.S. Cl.
CPC ....... *H03K 3/0375* (2013.01); *G01R 31/3177* (2013.01)

(58) Field of Classification Search
CPC ........................ H03K 3/0375; G01R 31/3177

USPC .......................................................... 327/199
See application file for complete search history.

(56) References Cited

U.S. PATENT DOCUMENTS

2020/0387426 A1* 12/2020 Jain ...................... G06F 11/076

OTHER PUBLICATIONS

Lotfi, Notice of Allowance, U.S. Appl. No. 16/560,893, dated Nov. 16, 2021, 10 pgs.

* cited by examiner

*Primary Examiner* — Tomi Skibinski
(74) *Attorney, Agent, or Firm* — Morgan, Lewis & Bockius LLP

(57) ABSTRACT

This application is directed to methods and devices of detecting and correcting a fault in an integrated circuit. A latching circuit outputs a first voltage level at an output, and a function control signal is generated to hold the first voltage level outputted by the latching circuit. A single event upset originates within the latching circuit and causes the first voltage level at the output of the latching circuit to transition to a second voltage level. When the single event upset is detected, the latching circuit is controlled via a clear signal to reset its output to the first voltage level. A glitch is thereby formed on the first voltage level at the output of the latching circuit. The glitch is suppressed at the output of the latching circuit to generate the function control signal holding the first voltage level without the glitch.

20 Claims, 17 Drawing Sheets

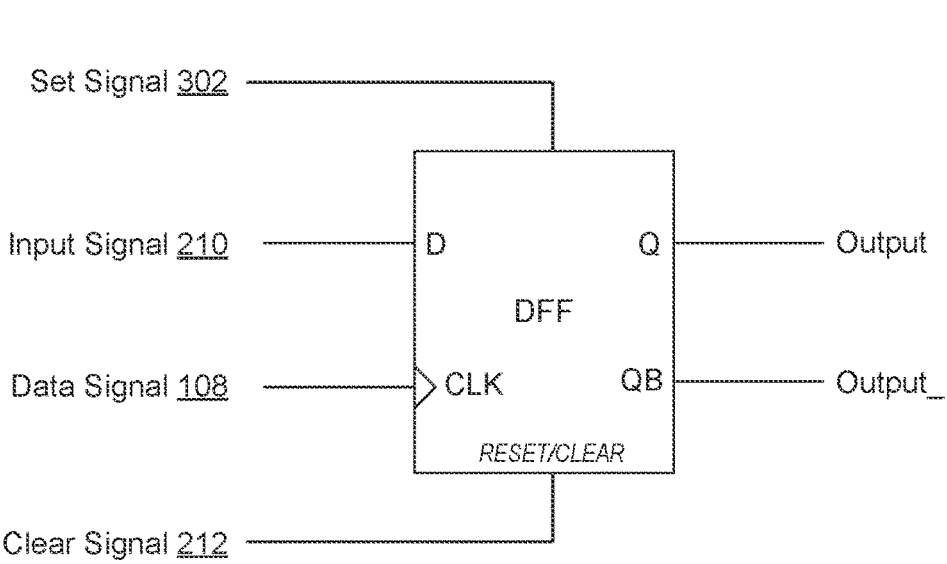
Figure 3A
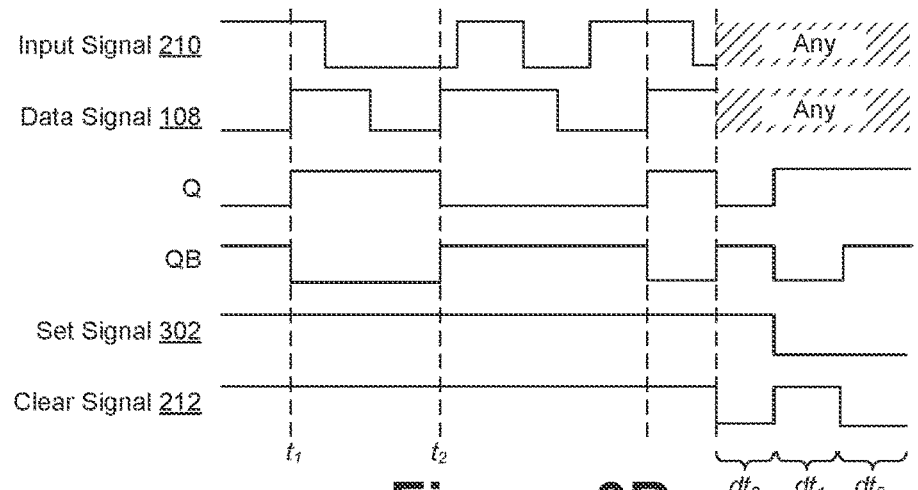
Figure 3B
| Set | Clear | Input | Data | Q | QB |
|---|---|---|---|---|---|
| 0 | 1 | - | - | 1 | 0 |
| 1 | | | | | |
| 0 | 0 | - | - | 1 | 1 |
| 1 | | | | | |
| 1 | | | | | |
Figure 3C

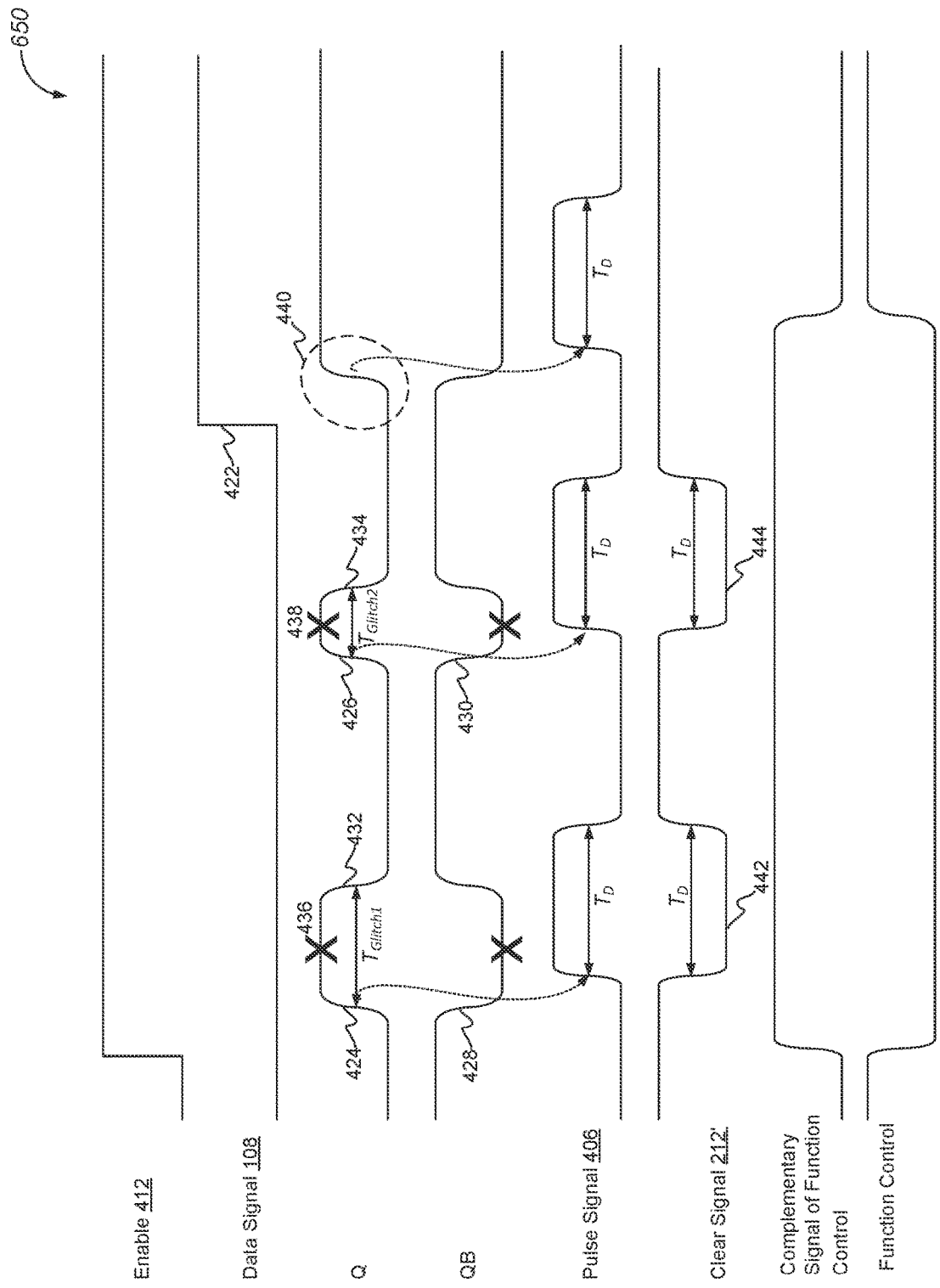

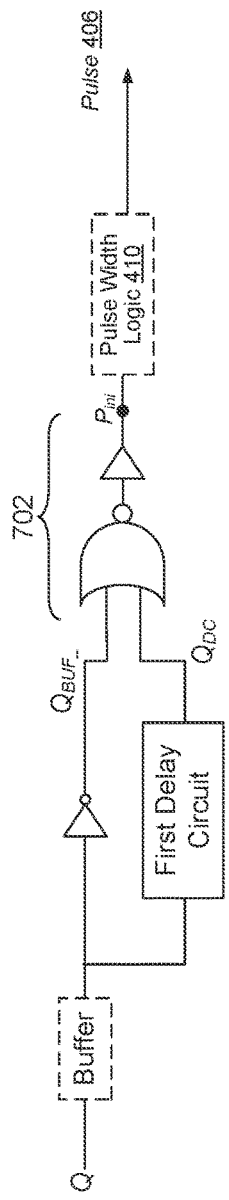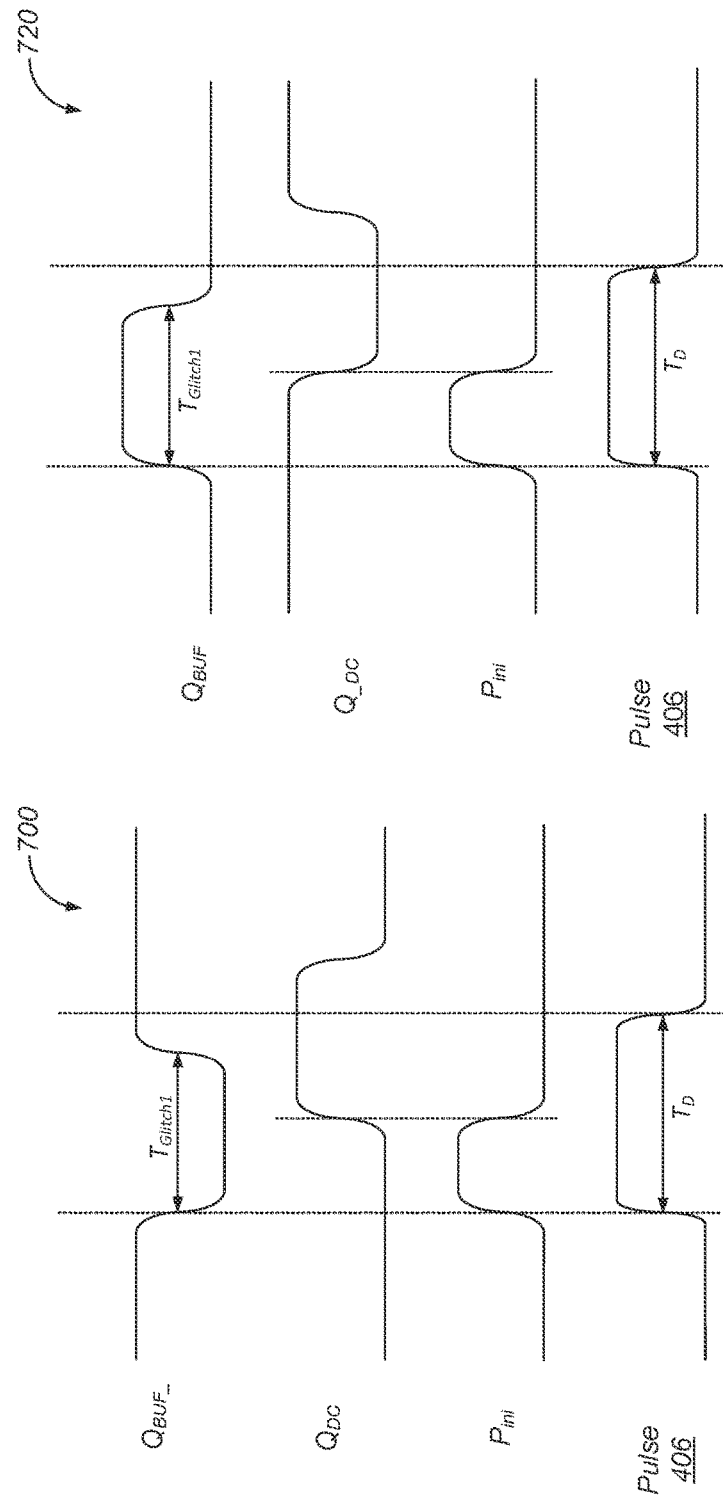
Figure 7A
Figure 7B
Figure 7C

```
┌─────────────────────────────────────────────────────────────────┐  ┌─ 1000
│ Generate a function control signal holding the first voltage level outputted by │
│ the latching circuit 1010                                       │
│                         (A)                                     │
│   ┌─────────────────────────────────────────────────────────┐   │
│   │ In response to detection of the single event upset, control the latching │
│   │ circuit via the clear signal to reset the output of the latching circuit to │
│   │ the first voltage level, wherein a glitch is formed on the first voltage │
│   │ level at the output of the latching circuit in response to the single │
│   │ event upset 1018                                        │   │
│   │   ┌─────────────────────────────────────────────────┐   │   │
│   │   │ The clear signal includes a pulse corresponding to the single │
│   │   │ event upset and the glitch on the first voltage level held at the │
│   │   │ output of the latching circuit, and the pulse of the clear signal │
│   │   │ has a pulse width configured to be greater than an estimated │
│   │   │ duration of the glitch 1020                     │   │   │
│   │   │   ┌─────────────────────────────────────────┐   │   │   │
│   │   │   │ Estimate the duration of the glitch 1022 │   │   │
│   │   │   └─────────────────────────────────────────┘   │   │   │
│   │   │   ┌─────────────────────────────────────────┐   │   │   │
│   │   │   │ Determine the pulse width based on the estimated │   │
│   │   │   │ duration of the glitch 1024             │   │   │   │
│   │   │   └─────────────────────────────────────────┘   │   │   │
│   │   └─────────────────────────────────────────────────┘   │   │
│   └─────────────────────────────────────────────────────────┘   │
│   ┌─────────────────────────────────────────────────────────┐   │
│   │ Suppress the glitch at the output of the latching circuit to generate the │
│   │ function control signal holding the first voltage level without the glitch │
│   │ 1026                                                    │   │
│   │   ┌─────────────────────────────────────────────────┐   │   │
│   │   │ While delaying the output of the latching circuit for outputting │
│   │   │ via the function control signal: 1028           │   │   │
│   │   │   ┌─────────────────────────────────────────┐   │   │   │
│   │   │   │ In accordance with a determination of operating within a │
│   │   │   │ pulse of the clear signal, select the first voltage level to │
│   │   │   │ be outputted to the function control signal 1030 │   │
│   │   │   └─────────────────────────────────────────┘   │   │   │
│   │   │   ┌─────────────────────────────────────────┐   │   │   │
│   │   │   │ In accordance with a determination of operating outside │
│   │   │   │ the pulse of the clear signal, select the delayed output │
│   │   │   │ of the latching circuit to be outputted via the function │
│   │   │   │ control signal 1032                     │   │   │   │
│   │   │   └─────────────────────────────────────────┘   │   │   │
│   │   └─────────────────────────────────────────────────┘   │   │
│   └─────────────────────────────────────────────────────────┘   │
│                         (B)                                     │
└─────────────────────────────────────────────────────────────────┘
```

Figure 10B

```
┌─────────────────────────────────────────────────────────────────────┐  ╱─ 1000
│ Generate a function control signal holding the first voltage level  │
│ outputted by the latching circuit 1010          (B)                 │
│                                                                     │
│  ┌───────────────────────────────────────────────────────────────┐  │
│  │ Control a core function according to the function control     │  │
│  │ signal 1034                                                   │  │
│  │  ┌─────────────────────────────────────────────────────────┐  │  │
│  │  │ When the function control signal holds the first        │  │  │
│  │  │ voltage level, monitor an electrical characteristic     │  │  │
│  │  │ associated with the core function 1036                  │  │  │
│  │  └─────────────────────────────────────────────────────────┘  │  │
│  │                              ↓                                │  │
│  │  ┌─────────────────────────────────────────────────────────┐  │  │
│  │  │ Detect an abnormal event based on the electrical        │  │  │
│  │  │ characteristic associated with the core function 1038   │  │  │
│  │  └─────────────────────────────────────────────────────────┘  │  │
│  │                              ↓                                │  │
│  │  ┌─────────────────────────────────────────────────────────┐  │  │
│  │  │ Output the data signal including a trigger event        │  │  │
│  │  │ associated with the abnormal event 1040                 │  │  │
│  │  └─────────────────────────────────────────────────────────┘  │  │
│  │                              ↓                                │  │
│  │  ┌─────────────────────────────────────────────────────────┐  │  │
│  │  │ In response to the trigger event of the data signal,    │  │  │
│  │  │ refresh the latching circuit to latch a voltage level   │  │  │
│  │  │ of the input signal at the output of the latching       │  │  │
│  │  │ circuit 1042                                            │  │  │
│  │  └─────────────────────────────────────────────────────────┘  │  │
│  │                              ↓                                │  │
│  │  ┌─────────────────────────────────────────────────────────┐  │  │
│  │  │ Refresh the function control signal based on the        │  │  │
│  │  │ output of the latching circuit 1044                     │  │  │
│  │  └─────────────────────────────────────────────────────────┘  │  │
│  └───────────────────────────────────────────────────────────────┘  │
│                                                                     │
│  ┌───────────────────────────────────────────────────────────────┐  │
│  │ Detect a trigger event in the data signal received by the     │  │
│  │ latching circuit 1046                                         │  │
│  └───────────────────────────────────────────────────────────────┘  │
│                                 ↓                                   │
│  ┌───────────────────────────────────────────────────────────────┐  │
│  │ In response to detection of the trigger event in the data     │  │
│  │ signal: 1048                                                  │  │
│  │  ┌─────────────────────────────────────────────────────────┐  │  │
│  │  │ Control the latching circuit to sample the input        │  │  │
│  │  │ signal at a first time 1050                             │  │  │
│  │  └─────────────────────────────────────────────────────────┘  │  │
│  │                              ↓                                │  │
│  │  ┌─────────────────────────────────────────────────────────┐  │  │
│  │  │ Refresh the function control signal to hold the second  │  │  │
│  │  │ voltage level corresponding to the input signal         │  │  │
│  │  │ sampled at the first time 1052                          │  │  │
│  │  └─────────────────────────────────────────────────────────┘  │  │
│  │                             (C)                               │  │
│  └───────────────────────────────────────────────────────────────┘  │
└─────────────────────────────────────────────────────────────────────┘
```

Figure 10C

Generate a function control signal holding the first voltage level outputted by the latching circuit 1010

In response to detection of the trigger event in the data signal: 1048

(C)

The trigger event corresponds to a first edge of the data signal, the method further comprising holding the second voltage level at the output of the latching circuit until detecting a clear event in the clear signal or until detecting a second edge in the data signal subsequent to the first edge 1054

The first and second edges are rising edges of the data signal 1056

One of the first and second edges is a falling edged of the data signal, and the other of the first and second edges is a rising edge of the data signal 1058

Thee trigger event corresponds to the data signal being biased at the second voltage level, the method further comprising tracking the input signal at the output of the latching circuit while the data signal is biased at the second voltage level 1060

Figure 10D

DETECTION AND CORRECTION OF SINGLE EVENT UPSET (SEU) IN INTEGRATED CIRCUIT

RELATED APPLICATIONS

This application is a continuation of and claims priority to U.S. patent application Ser. No. 16/560,893, filed Sep. 4, 2019, entitled "Detection and Correction of Single Event Upset (SEU) in Integrated Circuit," which is hereby incorporated by reference in its entirety.

TECHNICAL FIELD

The disclosed embodiments relate generally to integrated circuits, and in particular to controlling single event upsets that originate internally from a memory element (e.g., a D-type flip flop) and change a state of an output of an electronic device controlled by the memory element.

BACKGROUND

Many of today's electronic devices include processors and memory made of integrated circuit that may need to operate in severe environments, e.g., a harsh radiation environment exposed to heavy ionized particles. A single event upset occurs when an ionized particle (e.g., photon, electron, proton and ion) strikes a sensitive node in the integrated circuit and causes a change of state of the integrated circuit, which can result in propagation of wrong logic values to gates or registers driven by the integrated circuit. Duplications of the integrated circuit are oftentimes used in parallel to provide multiple outputs simultaneously, and a majority logic level at these outputs is selected as a valid output that is not impacted by the single event upset. Despite its effectiveness, this solution is expensive because it requires a large chip area to accommodate the duplications of the integrated circuit. It would be desirable to provide a method and system that can detect and control the single event upset in integrated circuit effectively while utilizing the chip area efficiently.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to monitoring and controlling single event upsets in dynamic integrated circuit effectively without duplicating the integrated circuit impacted by the single event upsets. Specifically, the integrated circuit incorporates additional circuit to monitor an output of a memory element (also called a latching circuit) and generate a single shot pulse in response to detection of a single event upset. This single shot pulse is applied to generate a control that is provided back to the memory element to refresh the output of the memory element and clear any faulty single event upset on the output of the memory element.

In accordance with one aspect of the application, there is provided a fault suppression method implemented by an electronic device including a latching circuit. The fault suppression method includes receiving by the latching circuit an input signal, a data signal and a clear signal and outputting by the latching circuit a first voltage level at an output of the latching circuit. The fault suppression method further includes generating a function control signal holding the first voltage level outputted by the latching circuit. Generating the function control signal further includes detecting a single event upset that originates within the latching circuit and causes the first voltage level at the output of the latching circuit to transition to a second voltage level, and in response to detection of the single event upset, controlling the latching circuit via the clear signal to reset the output of the latching circuit to the first voltage level. A glitch is formed on the first voltage level at the output of the latching circuit in response to the single event upset. Generating the function control signal further includes suppressing the glitch at the output of the latching circuit to generate the function control signal holding the first voltage level without the glitch.

In some implementations, the clear signal includes a pulse corresponding to the single event upset and the glitch on the first voltage level held at the output of the latching circuit. The pulse of the clear signal is triggered by a rising edge of the glitch on the first voltage level, and has a pulse width configured to be greater than a duration of the glitch. That said, in some situations, the pulse width is adjusted and programmed according to a width of a possible transient upset originating from the latching circuit, such that the pulse width exceeds the width of the possible transient upset of the latching circuit.

According to another aspect, there is provided a single event upset (SEU) suppression method implemented by an electronic device having a D-type flip flop (DFF). The SEU suppression method includes receiving by the DFF an input signal, a data signal and a clear signal and outputting by the DFF a first voltage level at an output of the DFF. The SEU suppression method further includes generating a function control signal holding the first voltage level outputted by the DFF. Generating the function control signal further includes detecting a single event upset that originates within the DFF and causes the first voltage level at the output of the DFF to transition to a second voltage level, and in response to detection of the single event upset, controlling the DFF via the clear signal to reset the output of the DFF to the first voltage level. A glitch is formed on the first voltage level at the output of the DFF in response to the single event upset. Generating the function control signal further includes suppressing the glitch at the output of the DFF to generate the function control signal holding the first voltage level without the glitch.

According to another aspect, there is provided an electronic device that includes a latching circuit, a fault detection circuit, a fault clear circuit and an output control circuit configured to implement any of the above described fault suppression methods jointly.

The methods, systems, and non-transitory computer readable storage media herein address existing problems of controlling (e.g., suppressing, compensating for) a single event upset originated within an integrated circuit such that any logic error induced by the single event upset is corrected locally and does not propagate to circuit driven by the integrated circuit.

BRIEF DESCRIPTION OF THE DRAWINGS

So that the present disclosure can be understood in greater detail, a more particular description may be found by reference to the features of various implementations, some of which are illustrated in the appended drawings. The appended drawings, however, merely illustrate the more pertinent features of the present disclosure and are therefore not to be considered limiting, for the description may admit to other effective features.

FIGS. 3A-3C illustrate a signal interface 300, time diagrams of input and output signals, and a logic operation table of a D-type flip flop (DFF) in accordance with some embodiments.

FIG. 7A is a block diagram of another example fault detection circuit in accordance with some embodiments, and FIG. 7B illustrates time diagrams of signals in the fault detection circuit shown in FIG. 7A in accordance with some embodiments. FIG. 7C illustrates time diagrams of signals in the fault detection circuit shown in FIG. 4A in accordance with some embodiments.

FIGS. 10A-10D illustrate a representative flow chart of a method for suppressing a fault in an integrated circuit in accordance with some embodiments.

Figure 1:
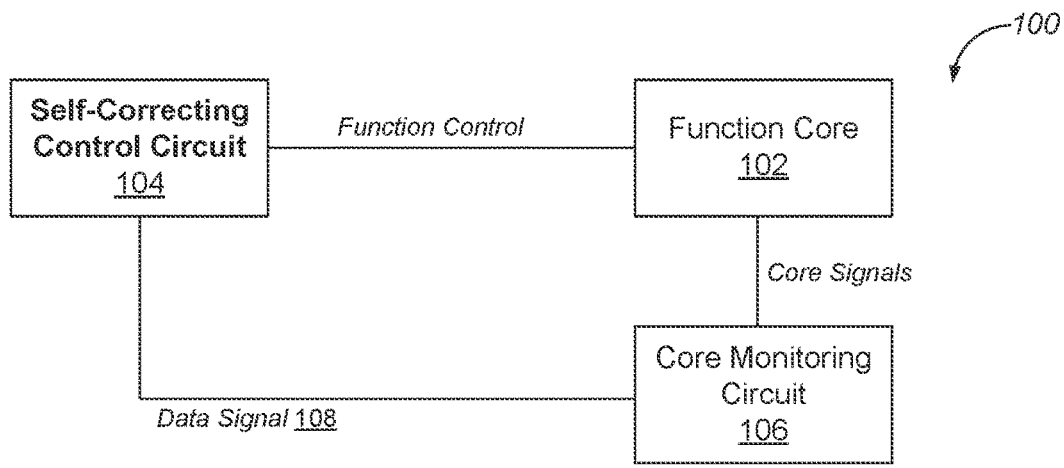
FIG. 1 illustrates a representative electronic system configured to hold a function control signal applied to control a functional core in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include methods and electronic devices for controlling a fault (e.g., a single event upset) originating from a memory element without duplicating the memory elements on real estate of an electronic device. Specifically, the electronic device incorporates additional circuit to monitor an output of a memory element (also called a latching circuit) and generate a single shot pulse in response to detection of a single event upset. This single shot pulse is applied to generate a control that is provided back to the memory element to clear the faulty single event update on the output of the memory element.

In one aspect of this application, a fault suppression method is implemented by an electronic device including a latching circuit. The latching circuit receives an input signal, a data signal and a clear signal and outputs a first voltage level at an output of the latching circuit. A function control signal is generated to hold the first voltage level outputted by the latching circuit. A single event upset is detected to originate within the latching circuit and cause the first voltage level at the output of the latching circuit to transition to a second voltage level. In response to detection of the single event upset, the latching circuit is controlled via the clear signal to reset the output of the latching circuit to the first voltage level. A glitch is formed on the first voltage level at the output of the latching circuit in response to the single event upset. When the glitch is suppressed at the output of the latching circuit, the function control signal is generated to hold the first voltage level without the glitch.

In some embodiments, a core function is controlled (e.g., enabled) according to the function control signal or its complementary signal. When the first voltage level is held at the function control signal, an electrical characteristic associated with the core function is monitored. An abnormal event can be detected based on the electrical characteristic associated with the core function. At a time of the abnormal event, the data signal is updated to include a trigger event associated with the abnormal event, and the latching circuit latches a voltage level of the input signal at the output of the latching circuit in response to the trigger event of the data signal. The function control signal is refreshed based on the output of the latching circuit to disable the core function, so the trigger event terminates normal operation of the electronic device. In some embodiments, the input signal is constantly coupled to the second voltage level, waiting to be updated to the output of the latching circuit when the abnormal event happens.

In some embodiments, the second voltage level is outputted at the output of the latching circuit, and a clear event is detected in the clear signal. The first voltage level is outputted at the output of the latching circuit in place of the second voltage level in response to the clear event. Optionally, the first voltage level is lower than the second voltage level.

Further, in some embodiments, the trigger event corresponds to a first edge of the data signal. The second voltage level is held at the output of the latching circuit until detecting a clear event in the clear signal or until detecting a second edge in the data signal subsequent to the first edge. In some embodiments, the first and second edges are rising edges of the data signal. In some embodiments, the first and second edges are falling edges of the data signal. Alternatively, in some embodiments, one of the first and second edges is a falling edged of the data signal, and the other of the first and second edges is a rising edge of the data signal. Alternatively, the trigger event corresponds to the data signal being biased at the second voltage level. The data signal is tracked at the output of the latching circuit while the data signal is biased at the second voltage level.

In some embodiments, the clear signal includes a pulse corresponding to the single event upset and the glitch on the first voltage level held at the output of the latching circuit. The pulse of the clear signal has a pulse width configured to be greater than a duration of the glitch. Further, in some embodiments, durations of glitch pulses associated with the latching circuit are estimated, and the pulse width of the clear signal is pre-programmed based on the determined duration of the glitch. Further, in some embodiments, while the output of the latching circuit is delayed for outputting via the functional control signal, the first voltage level is selected to be outputted to the function control signal, i.e., bypass the output of the latching signal having the glitch, in accordance with a determination that the electronic device operates within the pulse of the clear signal. In accordance with a determining the electronic device operates outside the pulse in the clear signal, the delayed output of the latching signal is selected to be outputted to the functional control signal.

In another aspect of this application, an electronic device includes a latching circuit, a fault detection circuit, a fault clear circuit and an output control circuit. The latching circuit is configured to receive an input signal, a data signal and a clear signal and be controlled by the data signal to hold a first voltage level at an output. The fault detection circuit is coupled to the latching circuit and is configured to detect a single event upset that originates within the latching circuit and causes the first voltage level at the output of the latching circuit to transition to a second voltage level. The fault clear circuit is coupled between the fault detection circuit and the latching circuit, and is configured to generate a clear signal in response to detection of the single event upset and control the latching circuit to reset the output of the latching circuit to the first voltage level. A glitch is formed on the first voltage level at the output of the latching circuit in response to the single event upset. The output control circuit is coupled to the latching circuit and the fault clear circuit, and is configured to suppress the glitch at the output of the latching circuit and generate a function control signal holding the first voltage level without the glitch.

In yet another aspect of this application, a fault suppression method is implemented by an electronic device including a DFF. The DFF receives an input signal, a data signal and a clear signal and outputs a first voltage level at an output of the DFF. A function control signal is generated to hold the first voltage level outputted by the DFF. A single event upset is detected to originate within the DFF and cause the first voltage level at the output of the DFF to transition to a second voltage level. In response to detection of the single event upset, the DFF is controlled via the clear signal to reset the output of the DFF to the first voltage level. A glitch is formed on the first voltage level at the output of the DFF in response to the single event upset. When the glitch is suppressed at the output of the DFF, the function control signal is generated to hold the first voltage level without the glitch.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 illustrates a representative electronic system 100 configured to hold a function control signal applied to control a functional core 102 in accordance with some embodiments. The functional core 102 is configured to implement a core function, e.g., delivering a drive current to a light emitting diode. In addition to the function core 102, the electronic system 100 further includes a self-correcting control circuit 104 and a core monitoring circuit 106. The function control signal is outputted by the self-correcting control circuit 104 to control operation of the function core 102. For example, the function control signal is controlled between a first voltage level and a second voltage level that is optionally higher or lower than the first voltage level. One of the first and second voltage levels is configured to enable the function core 102, and the other of the first and second voltage levels is configured to disable the function core 102. While the function control signal enables the function core 102, an electrical characteristic of the function core 102 (e.g., a current, a voltage, a circuit speed) is monitored by the core monitoring circuit 106. Specifically, the core monitoring circuit 106 is configured to receive one or more core signals from the function core 102 and detect an abnormal event based on the electrical characteristic associated with the core function. In response to detection of the abnormal event, the core monitoring circuit 106 outputs a data signal 108 including a trigger event (e.g., a pulse, a transition between two logic levels) associated with the abnormal event. The self-correcting control circuit 104 receives the data signal 108, and responds to the trigger event of the data signal 108 by refreshing its output, i.e., the function control signal, to disable the function core 102. By these means, closed-loop functional control is enabled for operating the functional core 102.

In an example, while the function core 102 is enabled by the function control signal that is at the first voltage level, the core monitoring circuit 106 monitors a drive current of the function core 102 and determines whether the monitored drive current is greater than a current threshold. In accordance with a determination that the monitored drive current is greater than the current threshold, the core monitoring circuit 106 generates a pulse on the data signal 108 or switches the data signal 108 from a logic level of "0" to a logic level of "1." In response to the pulse or logic transition of the data signal 108, the self-correcting control circuit 104 controls the function control signal to change from the first voltage level to the second voltage level. The function core 102 is disabled under the second voltage level of the function control signal, such that the drive current of the function core 102 is reduced to zero or a level lower than the current threshold to protect the function core 102 from being damaged by an excessive drive current.

The self-correcting control circuit 104 includes a latching circuit configured to hold the function control signal at the first voltage level constantly. The abnormal event of the function core 102 may last for an extended period of time or is a transient event lasting for a brief period of time. The self-correcting control circuit 104 switches the function control signal to the second voltage level and holds the second voltage level in response to a start of the abnormal event, regardless of whether the abnormal event lasts or is transient. In many situations, the self-correcting control circuit 104 holds the function control signal at the second voltage level until receiving a data refresh or clear signal to restart operation of the function core 102.

In some embodiments, when the function control signal is held at the first voltage level, a single event upset (SEU) originates within the latching circuit of the self-correcting control circuit 104 and causes the function control signal to transition to the second voltage level. That said, the SEU can change operation of the function core 102 independently of whether there is any abnormal event detected in operation of the function core 102. In some situations, the SEU causes the function control signal to transition to and stay at the second voltage level, while in some situations, the SEU causes the function control signal to go beyond the second voltage level momentarily prior to returning to the first voltage level. In both situations, the function control signal can be mistakenly reset to the second voltage level and change the operation of the function core 102 in an undesirable manner. As such, the self-correcting control circuit 104 is configured to monitor the SEU and protect the function control signal from being impacted by the SEU originated internally in the latching circuit of the self-correcting control circuit 104.

Figure 2:
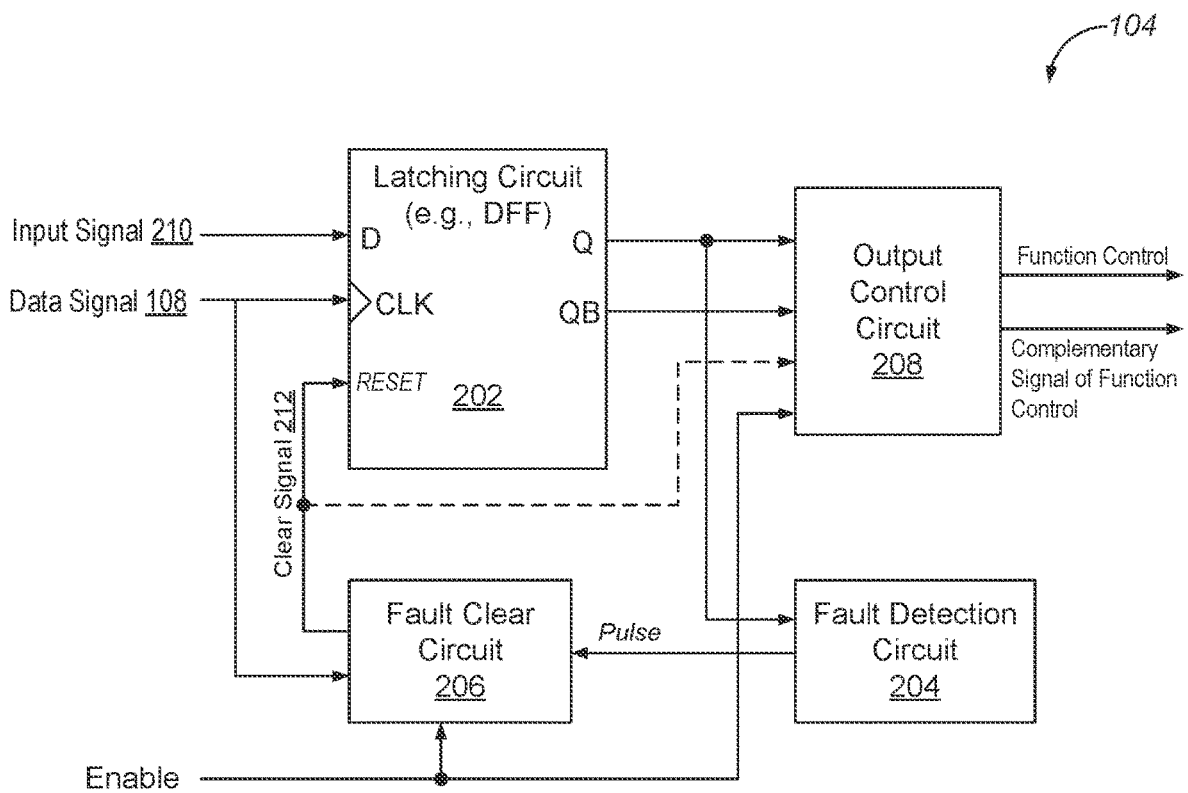
FIG. 2 is a block diagram of an example self-correcting control circuit in accordance with some embodiments.

FIG. 2 is a block diagram of an example self-correcting control circuit 104 in accordance with some embodiments. The self-correcting control circuit 104 is configured to monitor and suppress an SEU that originates internally in the self-correcting control circuit 104, and generate a function control signal that is not impacted by the SEU. The self-correcting control circuit 104 includes a latching circuit 202, a fault detection circuit 204, a fault clear circuit 206, and an output control circuit 208. The latching circuit 202 is configured to receive an input signal 210, a data signal 108 and a clear signal 212. During normal operation, the latching circuit 202 is controlled by the data signal 108 to hold a first voltage level or a second voltage level at an output Q of the latching circuit 202. The latching circuit 202 also has a complementary output QB that is configured to output a voltage level that is opposite to the first or second voltage level held by the output Q. In some embodiments, normal operation does not involve any SEU, and the input signal 210 is fixed at the second voltage level that is higher than the first voltage level. The clear signal 212 is optionally set at the first or second voltage level in the absence of the SEU. The output Q of the latching circuit 202 has the first voltage level, and switches to adopt a voltage level of the input signal 210 (e.g., the second voltage level) in response to a rising edge of the data signal 108. Alternatively, in some embodiments, the output Q of the latching circuit 202 is configured to adopt the voltage level of the input signal 210 in response to a falling edge, a high voltage level or a low voltage level of the data signal 108.

The fault detection circuit 204 is coupled to the latching circuit 202, and is configured to detect an SEU that originates within the latching circuit 202 and causes the first voltage level held at the output Q of the latching circuit 202 to transition to the second voltage level. The fault clear circuit 206 is coupled between the fault detection circuit 204 and the latching circuit 202, and is configured to generate the clear signal 212 in response to detection of the SEU. The clear signal 212 is applied to control the latching circuit 202 to reset the output Q of the latching circuit to the first voltage level. A glitch is thereby formed on the first voltage level at the output Q of the latching circuit 202 in response to the SEU. In some situations, the SEU is transient or lasts for an extended period of time. The glitch starts when the SEU starts, and is terminated when the output Q of the latching circuit 202 is reset to the first voltage level by the fault clear circuit 206. Alternatively, in some situations, the SEU is a transient event that lasts for a brief period of time (e.g., about 10 ns), and the glitch starts and ends with the SEU. The fault clear circuit 206 is configured to reset the output Q of the latching circuit 202 to the first voltage level, although the output Q may have returned to the first voltage level earlier when the SEU terminates.

The clear signal 212 generated by the fault clear circuit 206 includes one or more pulses each of which corresponds to one or more SEUs and has a starting edge and an ending edge. It is noted that the clear signal 212 may include one or more valleys corresponding to the SEUs on a logic level of "1" and that these valleys corresponding to the SEUs are broadly called "pulses." The starting edge of each pulse of the clear signal 212 is caused by one of the one or more SEU, and the ending edge of the respective pulse is defined by the fault clear circuit 206 to include the one or more SEU within the respective pulse. In some embodiments, the output Q of the latching circuit 202 is reset to the first voltage level during a duration of period corresponding to each pulse of the clear signal 212. In some embodiments, the output Q of the latching circuit 202 is reset to the first voltage level at the end of each pulse of the clear signal 212, rather than in the middle of the respective pulse of the clear signal 212.

The output control circuit 208 is coupled to the latching circuit 202, and is configured to suppress the glitch at the output Q of the latching circuit 202 and generate the function control signal holding the first voltage level without the glitch caused by the SEU. In some implementations, the output control circuit 208 receives the clear signal 212 and identifies an SEU according to a pulse of the clear signal 212. In some implementations, the output control circuit 208 does not receive the clear signal 212, but includes a filter configured to eliminate the glitch caused by the SEU. During the pulse of the clear signal 212, the first voltage level is outputted at the function control signal directly to avoid the glitch at the output Q of the latching circuit 202 from being passed to the function control signal, thereby protecting the function core 102 from being impacted by an internal fault of the latching circuit 202 caused by the SEU.

FIGS. 3A-3C illustrate a signal interface 300, time diagrams 320 of input and output signals, and a logic operation table 340 of a D-type flip flop (DFF) in accordance with some embodiments. Referring to FIG. 3A, the DFF has one or more inputs of an input signal 210, a data signal 108, a set signal 302 and a clear signal 212, and one of both of an output Q and its complementary output QB. The DFF is an example of the latching circuit 202, and is configured to be triggered at a rising or falling edge of the data signal 108 to sample and hold the input signal 210. For example, referring to FIG. 3B, when the data signal 108 switches from a logic level of "0" to a logic level of "1" at a first time $t_1$ (i.e., at a first rising edge), the output Q tracks the input signal that is at the logic level of "1" and the complementary output QB goes to the logic level of "0." Likewise, when the data signal 108 switches from "0" to "1" at a second time $t_2$ (i.e., at a second rising edge), the output Q tracks the input signal that is at the logic level of "0" and the complementary output QB goes to the logic level of "1."

The set signal 302 and the clear signal 212 are configured to set and reset the output Q and the complementary output QB of the DFF. In some embodiments, referring to FIGS. 3B and 3C, when both the set and clear signals are at the logic level of "0" (i.e., during a duration of time $dt_2$), both the output Q and the complementary output QB of the DFF are set to the logic level of "1." When the set signal 302 is at "0" and the clear signal 212 is at "1" (i.e., during a duration of time $dt_1$), the output Q is set to the logic level of "1" and the complementary output QB is set to the logic level of "0." When the set signal 302 is at "1" and the clear signal 212 is at "0" (i.e., during a duration of time $dt_0$), the output Q is set to the logic level of "0" and the complementary output QB is set to the logic level of "1." In some implementations, the set signal 302 is fixed at "1." The clear signal 212 is configured to enable data refreshing at the rising edges of the data signal 108 (when the clear signal 212 is at "1") or data resetting (when the clear signal 212 is at "0," i.e., during the duration of time $dt_0$).

Figure 3D:
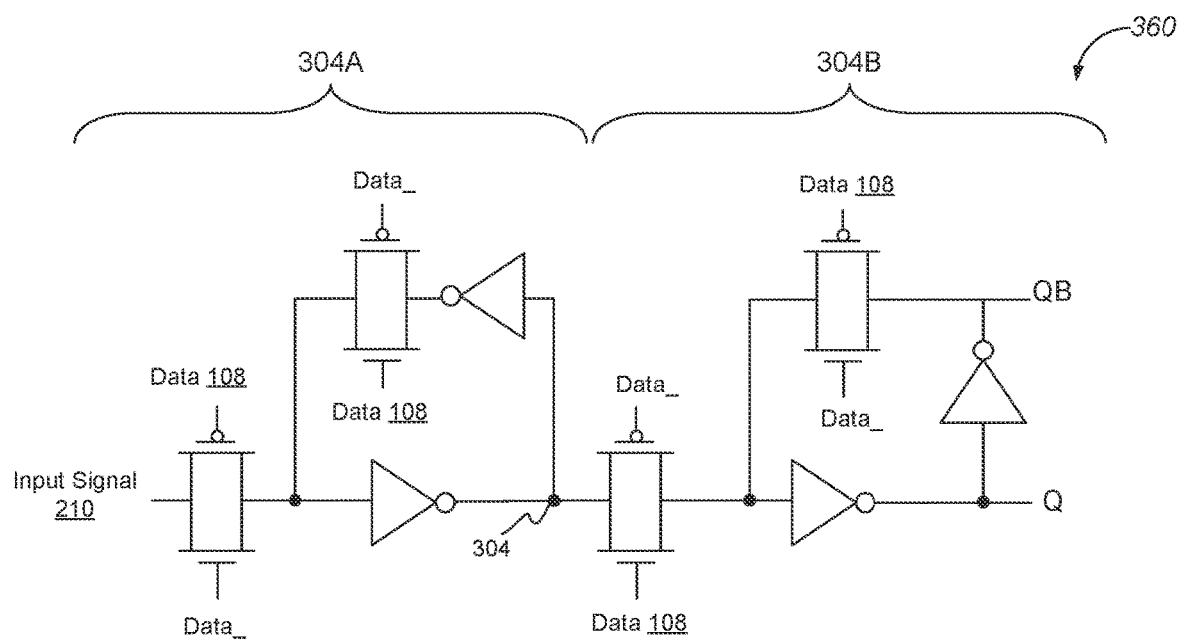
FIGS. 3D and 3E are two circuit schematics of a DFF having no set and reset signals and a DFF having set and reset signals (also called clear signals) in accordance with some embodiments, respectively.
Figure 3E:
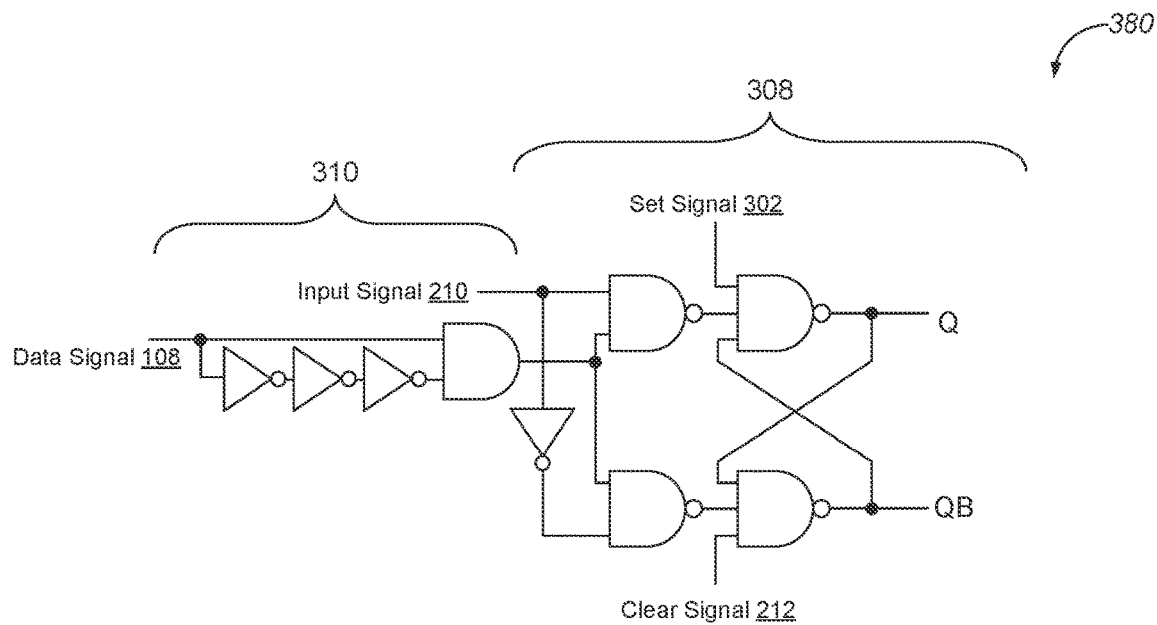
Figure 3F:
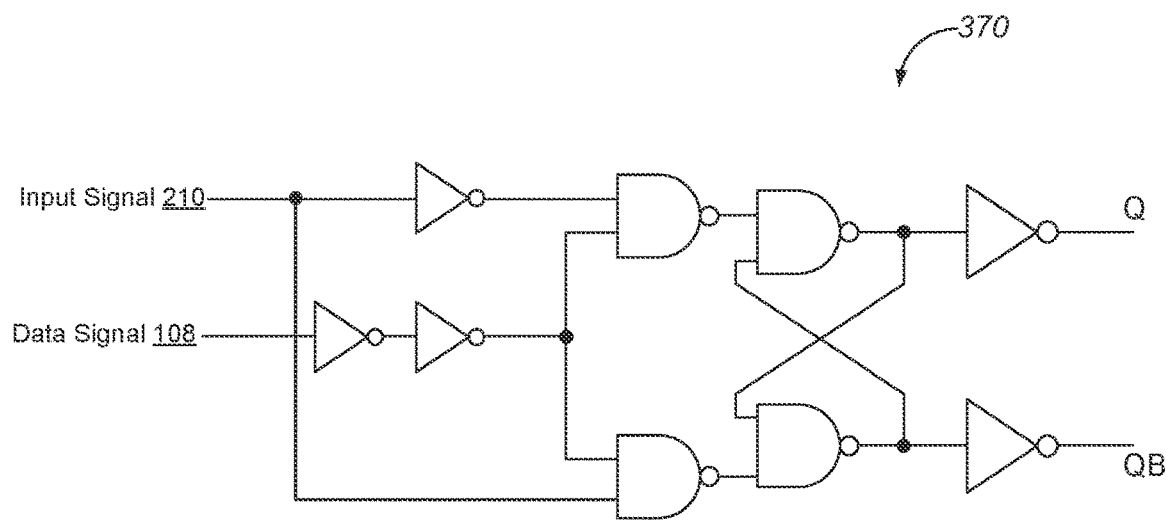
FIG. 3F is a circuit schematic of another example DFF having no set and reset signals in accordance with some embodiments.
Figure 3G:
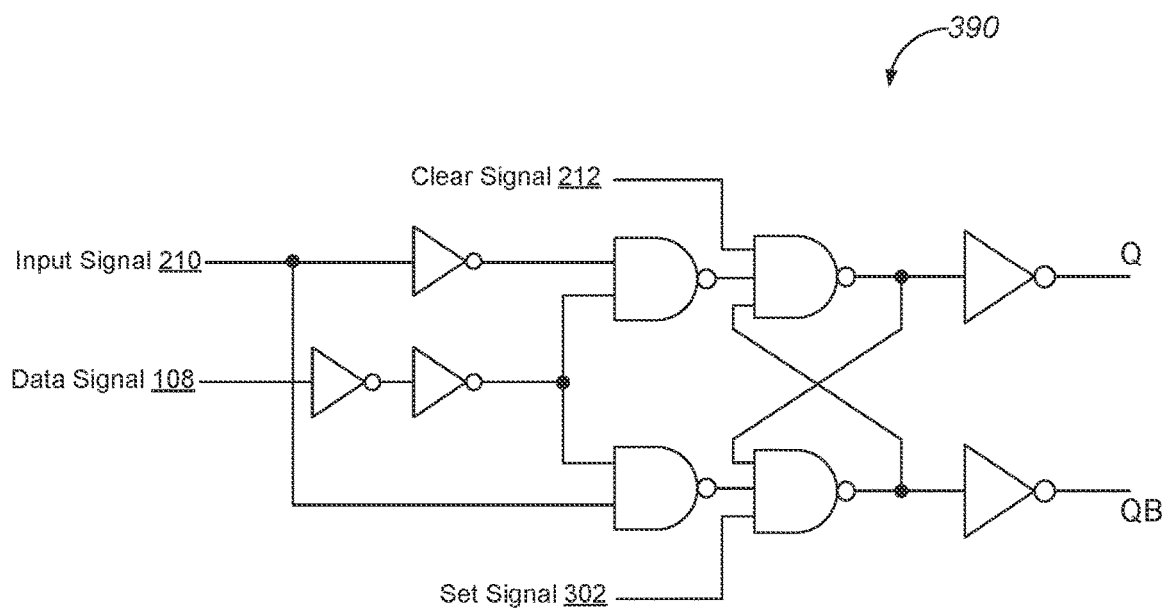
FIG. 3G is a circuit schematic of another example DFF having set and reset signals in accordance with some embodiments.

FIGS. 3D and 3E are two circuit schematics of a DFF 360 having no set and reset signals and a DFF 380 having set and reset signals in accordance with some embodiments, respectively. FIG. 3F is a circuit schematic of another example DFF 370 having no set and reset signals in accordance with some embodiments. FIG. 3G is a circuit schematic of another example DFF 390 having set and reset signals in accordance with some embodiments. Referring to FIG. 3D, in some embodiments, the DFF 360 includes two latches 304A and 304B. The latch 304A is configured to generate an intermediate signal 306 that tracks the input signal 210 while the data signal 108 is at a first voltage level, and the latch 304B is configured to generate the output Q that tracks the intermediate signal 306 at a second voltage level that is higher than the first voltage level. As a result, the output Q only adopts a voltage level of the intermediate signal 306 when the data signal 108 transitions from the first voltage level to the second voltage level, i.e., the output Q samples and holds the intermediate signal 306 at each rising edge of the data signal 108. Alternatively, in some embodiments not shown in FIG. 3D, connections to the data signal 108 (Data) and its complementary signal Data_are swapped, such that the output Q samples and holds the intermediate signal 306 at each falling edge of the data signal 108.

Referring to FIG. 3E, in some embodiments, the DFF 380 includes a D-type latch (D latch) 308 and an edge pulse detector 310 coupled at an input interface of the D latch 308 to receive the data signal 108. Optionally, the edge pulse detector 310 includes an AND logic gate and is configured to detect a rising edge of the data signal 108 and generate a short pulse at the detected rising edge. Optionally, the edge pulse detector 310 includes an NOR logic gate in place of the AND logic gate and is configured to detect a falling edge of the data signal 108 and generate a short pulse at the detected falling edge. During the short pulse associated with the detected rising or falling edge of the data signal 108, the input signal 210 is tracked by the output Q of the D latch 308, and held thereby after the short pulse ends. The DFF 380 is configured to receive the set signal 302, a clear signal 212 or both. The set and clear signals are set to "1" to enable data refreshing at the rising edges of the data signal 108. As described above with reference to FIGS. 3B and 3C, the set and clear signals are set to predetermined logic levels to reset the output Q to a logic level of "0" or "1."

Figure 4A:
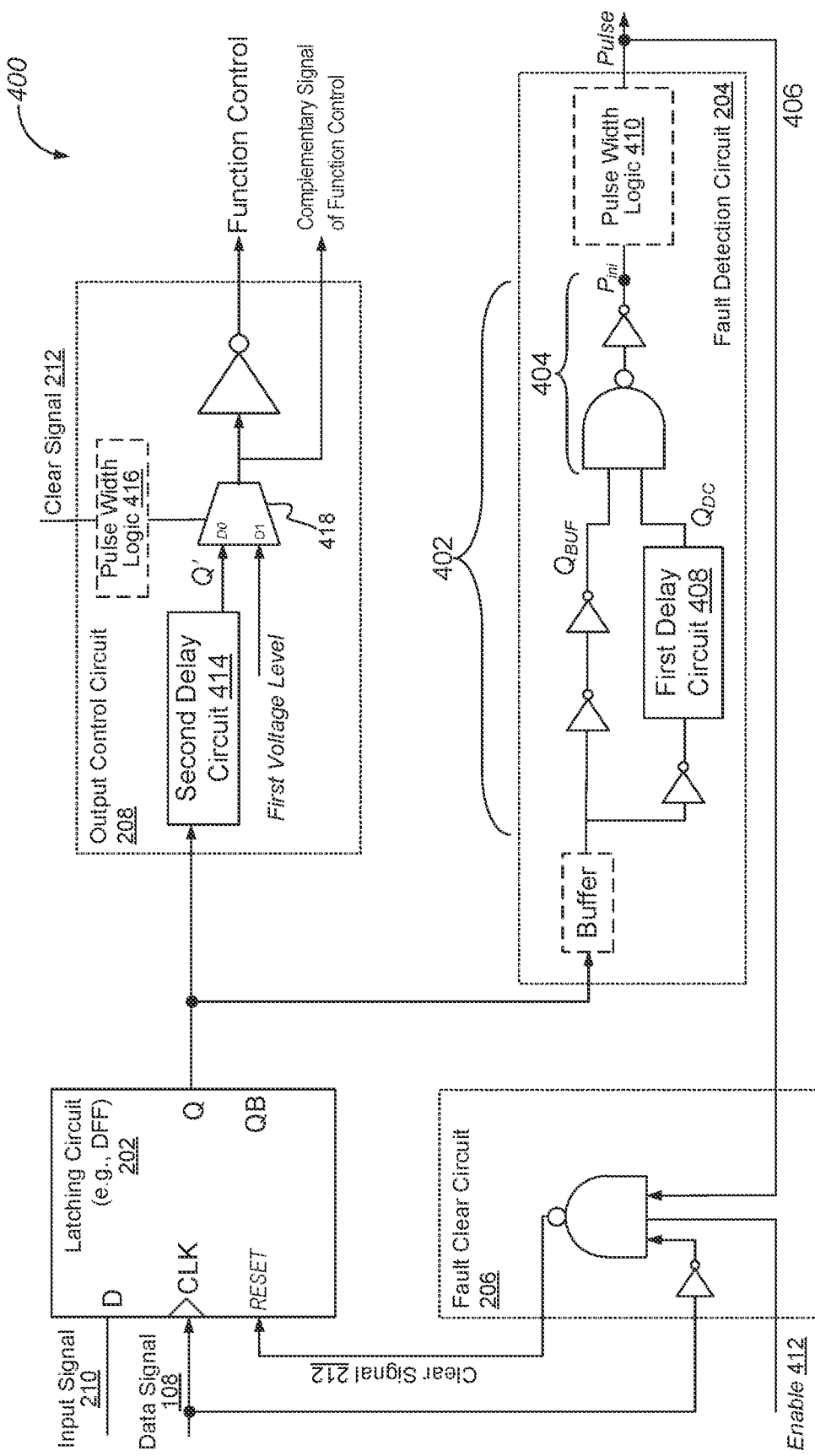
FIG. 4A is a block diagram of another example self-correcting control circuit in accordance with some embodiments, and FIG. 4B illustrate time diagrams of input/output and intermediate signals of the self-correcting control circuit shown in FIG. 4A in accordance with some embodiments.
Figure 4B:
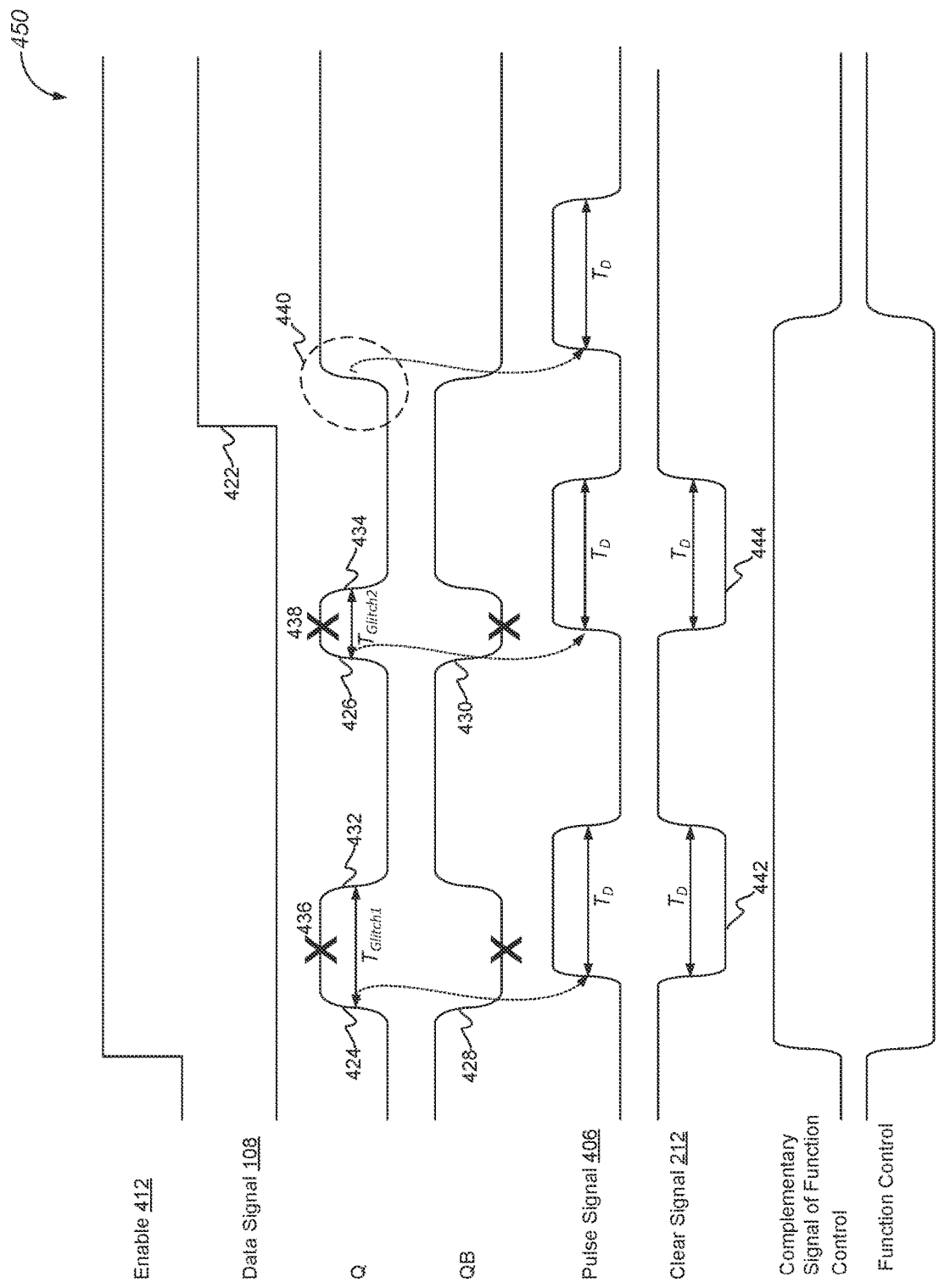

FIG. 4A is a block diagram of an example self-correcting control circuit 400 in accordance with some embodiments, and FIG. 4B illustrate time diagrams 450 of input/output and intermediate signals of the self-correcting control circuit 400 shown in FIG. 4A in accordance with some embodiments. The self-correcting control circuit 400 is configured to monitor and suppress an SEU that originates internally in the self-correcting control circuit 400 (specifically in its latching circuit 202) and generate a function control signal without being impacted by the SEU. The SEU is referred to an internal glitch in circuit due to single charge particle hitting a sensitive node in latching circuit that would cause the output of latching circuit to switch to opposite polarity causing fault or upset. Internal glitch could also be caused by noise in power supply or grounds to the circuit that may cause a temporary glitch at output of latching circuit (temporary interruption to the function control circuit) or may cause an output of latching circuit to change to opposite polarity causing upset. The self-correcting control circuit in 400 suppresses the fault associated with the temporary glitch at the output Q and the internal glitch that would have caused upset (i.e., a permanent change of state at the output Q of the latching circuit 202).

The self-correcting control circuit 104 includes a latching circuit 202, a fault detection circuit 204, a fault clear circuit 206, and an output control circuit 208. The latching circuit 202 is configured to receive an input signal 210, a data signal 108 and a clear signal 212, and be controlled by the data signal to hold a first voltage level or a second voltage level at an output Q of the latching circuit 202. An example of the latching circuit 202 is the DFF 380 shown in FIG. 3E. In some embodiments, the second voltage level is higher than the first voltage level, and the input signal 210 is fixed at the second voltage level. During normal operation, in response to a rising edge 422 of the data signal 108, the latching circuit 202 samples a voltage level of the input signal 210 at the rising edge 422 and holds the sampled voltage (i.e., the second voltage level in this example) at its output Q until a subsequent rising edge of the data signal 108 or until an internal SEU event. That said, the output Q of the latching circuit is held at the first voltage level immediately before the rising edge 422 of the data signal 108, and has a transition 440 from the first voltage level to the second voltage level as a result of being driven by the data signal 108. Thus, in some embodiments, the input signal 210 is constantly coupled to the second voltage level, and the second voltage level corresponds to a logic level of "1" that indicates that an abnormal event has occurred in a function core 102 coupled to the self-correcting control circuit 400.

Alternatively, in some implementations, the latching circuit 202 is a DFF triggered at falling edges. During normal operation, in response to a falling edge of the data signal 108, the latching circuit 202 samples a voltage level of the input signal 210 at the falling edge and holds the sampled voltage at its output Q until a subsequent falling edge of the data signal 108 or until an internal SEU event. Further, in some implementations, the latching circuit 202 is a level-triggered latch. During normal operation, in response to the data signal 108 being at a predetermined voltage level (e.g., the second voltage level), the latching circuit 202 tracks a voltage level of the input signal 210 and holds the sampled voltage at its output Q when the data signal 108 is not at the predetermined voltage level.

In some embodiments, a single event update (SEU) occurs when an ionizing particle (e.g., an ion, electrons or photon) strikes a sensitive node in the atmosphere surrounding the latching circuit 202 or in an electronic device including the latching circuit 202, creating free charges in or near a node of the latching circuit 202 and resulting in a state change at its output Q. Such a state change is not permanent, nor does it involve permanent damages to the latching circuit 202. Sources of the ionizing particle include, but are not limited to cosmic particles, high energy ionizing particles that exist as part of the natural background, solar particle events, high energy protons trapped in the Earth's magnetosphere, secondary atmospheric neutrons generated by cosmic rays and trace amounts of radioactive elements in chip packages. In some embodiments, integrated circuits applied in a spaceship or airplane tend to be exposed to these ionizing particle sources, and requires a higher robustness level against the SEU, e.g., by incorporating a self-monitoring and correction capability.

The fault detection circuit 204 is coupled to the latching circuit 202, and is configured to detect the SEU that originates within the latching circuit 202, thereby causing the first voltage level held at the output Q of the latching circuit 202 to transition to the second voltage level (e.g., at rising edges 424 and 426). It is noted that the fault detection circuit 204 includes and is based on an edge pulse detector 402. In some embodiments, the SEU is associated with a transition of the output Q from the first voltage level to the second voltage level higher than the first voltage level. The edge pulse detector 402 is either configured to detect a corresponding rising edge 424 or 426 at the output Q using a positive-edge pulse detector 402 or configured to detect a corresponding falling edge 428 or 430 at the complementary output QB using a negative-edge pulse detector 602 (shown in FIG. 6A). Alternatively, in some embodiments (not shown in FIGS. 4A and 4B), the SEU is associated with a transition of the output Q from the first voltage level to the second voltage level lower than the first voltage level. The edge pulse detector 402 is either configured to detect a corresponding falling edge at the output Q using a negative-edge pulse detector or configured to detect a corresponding rising edge at the complementary output QB using a positive-edge pulse detector. An example of the negative-edge pulse detector is implemented by replacing an AND logic 404 of the positive-edge pulse detector 402 with a NOR logic.

Figure 9A:
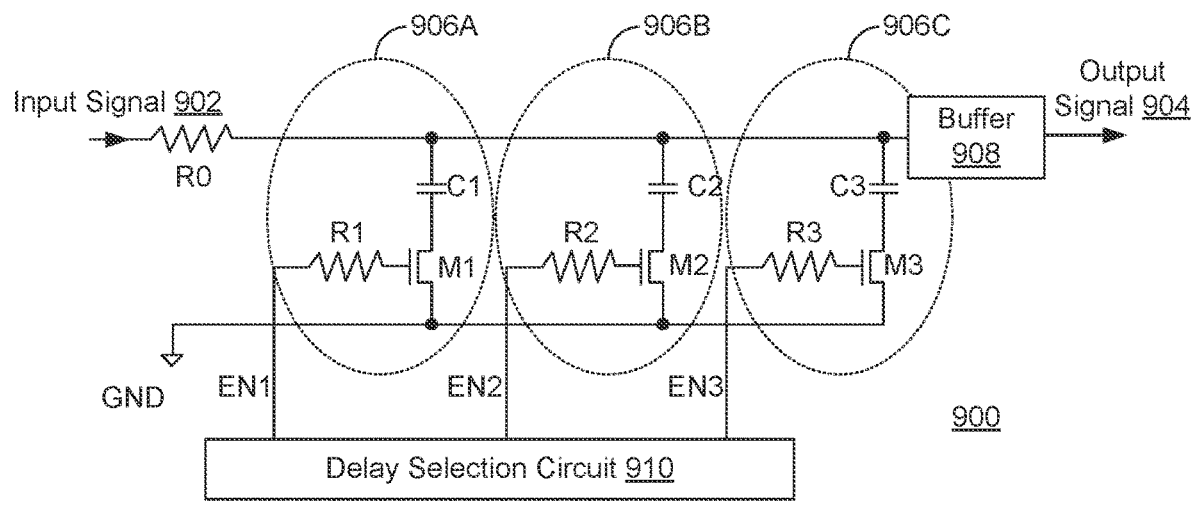
FIG. 9A is a block diagram of an adjustable delay circuit in accordance with some embodiments.

In response to detection of each SEU, the fault detection circuit 204 generates a pulse signal 406 having a pulse width $T_D$. The pulse width $T_D$ is programmed to be longer than a duration of time for which the SEU lasts. In some situations, the detected SEU is a start of a series of SEUs that closely follow each other, e.g., every two adjacent SEUs are temporally separated by less than a predetermined SEU separation time (e.g., 1 µs). The pulse width $T_D$ is programmed to be longer than a duration of time for which the series of SEUs last. In some embodiments, the pulse width $T_D$ is defined by a first delay circuit 408 of the edge pulse detector 402, particularly when the duration of time for which the SEU lasts is short (e.g., shorter than a threshold duration). More details on an example of the first delay circuit 408 having a programmable delay is shown in FIG. 9A. Alternatively, in some embodiments, the pulse width $T_D$ is defined jointly by the first delay circuit 408 and a pulse width logic 410 coupled to the edge pulse detector 402. As a result, the pulse width $T_D$ of the pulse signal 406 is programmed to outlast the SEU or the series of corresponding SEUs associated with the latching circuit 202.

The pulse signal 406 generated by the fault detection circuit 204 is provided to the fault clear circuit 206 that is coupled between the fault detection circuit 204 and the latching circuit 202. The fault clear circuit 206 is configured to generate the clear signal 212 in response to detection of the SEU. The clear signal 212 is used to control the latching circuit 202 to reset the second voltage level to the first voltage level at the output Q of the latching circuit 202. Specifically, when each pulse of the pulse signal 406 corresponding to an SEU starts, the clear signal 212 drops to a logic level of "0," and therefore, the output Q of the latching circuit 202 is reset to the logic level of "0," e.g., at falling edges 432 and 434. In some situations, regardless of whether the SEU is transient or lasts for an extended period of time, a glitch 436 or 438 starts when the SEU starts, and is terminated when the output of the latching circuit 202 is reset to the first voltage level by the fault clear circuit 206. Alternatively, in some situations not shown in FIG. 4B, the SEU is a transient event that lasts for a brief period of time (e.g., about 10 ns), and the glitch starts and ends with the SEU. The fault clear circuit 206 is configured to reset the output Q of the latching circuit 202 to the first voltage level, although the output Q may have returned to the first voltage level earlier when the SEU terminates. As such, the glitch is formed on the first voltage level at the output Q of the latching circuit in response to the SEU.

Each glitch 436 or 438 has a respective glitch width $T_{Glitch1}$ or $T_{Glitch2}$ that includes a respective SEU or a series of temporally close SEUs. In some embodiments, the pulse width $T_D$ of the pulse signal 406 is programmed by the first delay circuit 408 or the pulse width logic 410 to be greater than a duration (e.g., $T_{Glitch1}$ and $T_{Glitch2}$ in FIG. 4B) of any glitch on the output Q of the latching circuit 202. In some embodiments, the fault clear circuit 206 does not include any width programming circuit, and a pulse width of the clear signal 212 is substantially equal to the pulse width $T_D$ of the pulse signal 406 generated by the fault detection circuit 204. In some embodiments, the pulse width logic 410 is part of the fault clear circuit 206. In some embodiments, the fault clear circuit 206 has an additional pulse width logic (not shown) configured to adjust and program the pulse width $T_D$ of the clear signal 212 in addition to the pulse width logic 410 of the fault detection circuit 204.

In some embodiments, the self-correcting control circuit 400 is controlled by a global enable signal 412. The fault clear circuit 206 includes a logic circuit configured to enable the clear signal 212 when the global enable signal 412 is enabled and the data signal 108 is disabled. That said, only when the global enable signal 412 is enabled and the data signal 108 is disabled, the clear signal 212 can be enabled for resetting the output Q to the first voltage level (i.e., output a logic level of "0" on the clear signal 212) in response to detection of an SEU. Valleys 442 and 444 of the clear signal 212 (also called pulses of the clear signal 212) correspond to the SEUs, but not to the desired transition 440 on the output Q of the latching circuit 202.

Referring to FIG. 4B, the output Q of the latching circuit 202 has two glitches 436 and 438 and the transition 440 from the first voltage level to the second voltage level. The output control circuit 208 is coupled to the latching circuit 202, and is configured to suppress the glitches 436 and 438 at the output Q of the latching circuit 202 and generate the function control signal holding the first voltage level without the glitches 436 and 438. Stated another way, the output control circuit 208 is configured to eliminate an undesirable impact by the SEUs generated internally from the latching circuit 202 while tracking the input signal 210. In some embodiments, the output control circuit 208 is controlled by the global enable signal 412, and is configured to output the function control signal accordingly.

Figure 5:
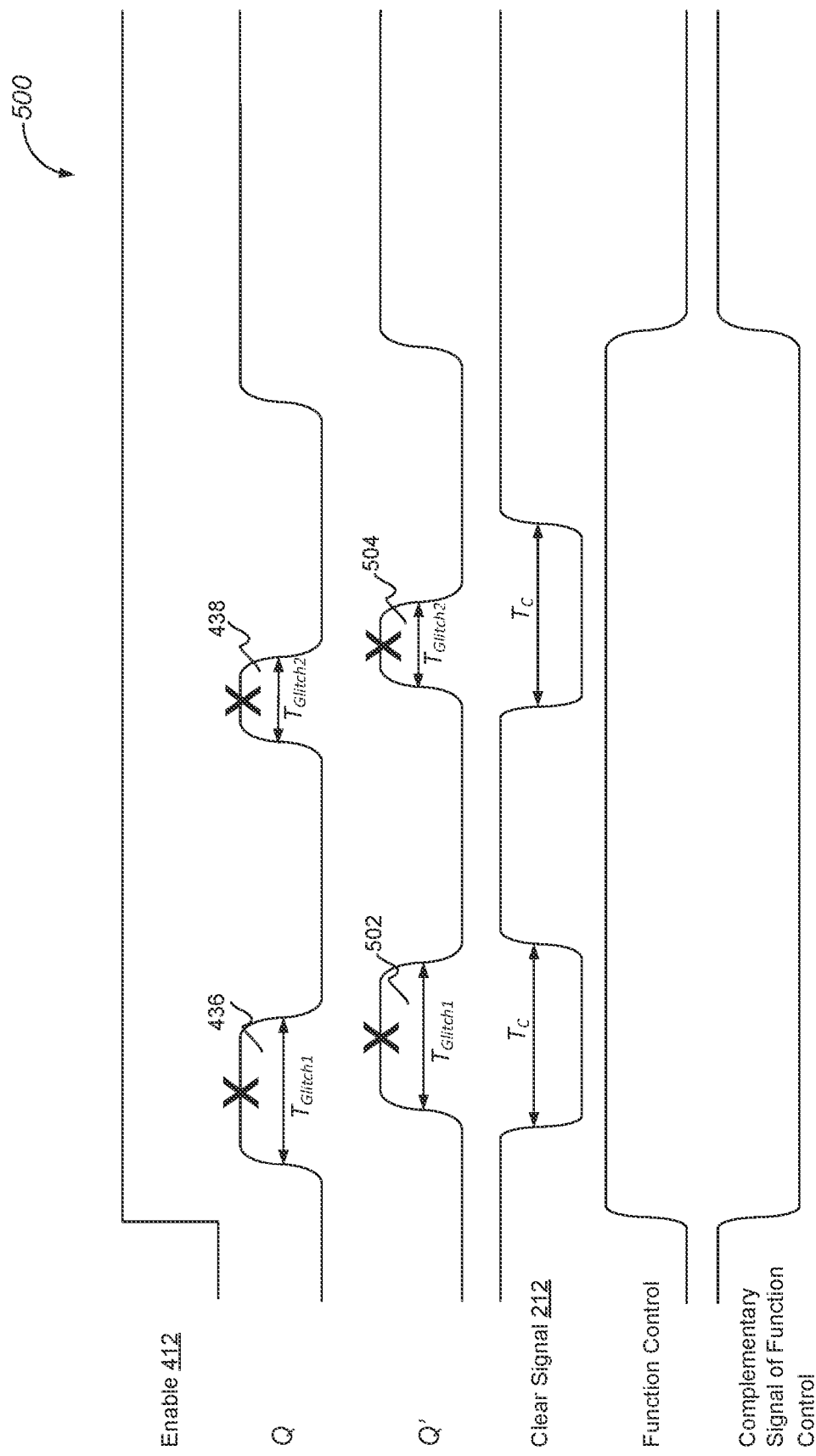
FIG. 5 illustrates time diagrams of signals in an example output control circuit shown in FIG. 4A in accordance with some embodiments.

FIG. 5 illustrates time diagrams 500 of signals in an example output control circuit 208 shown in FIG. 4A in accordance with some embodiments. The output control circuit 208 includes a second delay circuit 414 and a multiplexer 418. The second delay circuit 414 is configured to receive and delay the output Q of the latching circuit 202 to generate a delayed latch output Q'. The delayed latch output Q' has two glitches 502 and 504 corresponding to the glitches 436 and 438. The two glitches 502 and 504 overlap and are contained within the pulses 442 and 444 of the clear signal 212. The multiplexer 418 determines whether the output control circuit 208 operates outside or within the pulses 442 and 444 of the clear signal 212. In accordance with a determination of operating within the pulse 442 or 444 of the clear signal 212, the multiplexer 418 selects the first voltage level to be outputted to the function control signal, i.e., bypasses the delayed latch output Q' of the latching circuit 202. In contrast, in accordance with a determination of operating outside the pulse 442 or 444 of the clear signal 212, the multiplexer 418 selects the delayed latch output Q' to be outputted via the function control signal.

It is noted that the two glitches 502 and 504 overlap and are contained within the pulses 442 and 444 of the clear signal 212. In some embodiments, the second delay circuit 414 of the output control circuit 208 provides a second delay time to the output Q of the latching circuit 202, and the second delay time is greater than a first delay time that is indirectly introduced by the first delay circuit 408 into the clear signal 212. That said, the second delay time is selected to allow the output control circuit 208 to wait for the fault detection and clear circuits 204 and 206 to determine whether a corresponding transition between the first and second voltage levels is caused by an internal SEU event or by the transition 440 of the data signal 108. Additionally, in some embodiments, the output control circuit 208 further includes a pulse width logic 416 to increase a width of each pulse of the clear signal 212, such that the delayed latch output Q' is contained within the clear signal 212.

The function control signal tracks the data signal 108 when the global enable signal 412 is enabled. For example, in response to the transition 440 of the data signal 108 from the first voltage level to the second voltage level, the function control signal also transitions from the first voltage level to the second voltage level. However, under some circumstances, the function control signal is inverted by the function core 102 before the function control signal is used to control the function core 102. Alternatively, the self-correcting control circuit 400 provides a complementary signal of the function control signal that can be used to control the function core 102. The data signal 108 and the complementary signal of the function control signal have opposite logics, because the complementary signal ("0") is applied to turn off the function core 102 in response to detection of an abnormal event in the function core 102 (i.e., when the data signal 108 switches from "0" to "1"). That said, in response to the detection of the abnormal event, the data signal 108 and the output Q of the latching circuit 202 switch to a logic level of "1." The function control signal tracks the data signal 108, but its complementary signal is disabled, i.e., switches to a logic level of "0," to turn off the function core 102. As a result, when the global enable signal 412 is enabled, the function control signal and its complementary signal track the transition of the data signal 108 at its rising edge 422, but do not respond to the SEU events that occurs while the function control signal holds the first or second voltage level.

Figure 6A:
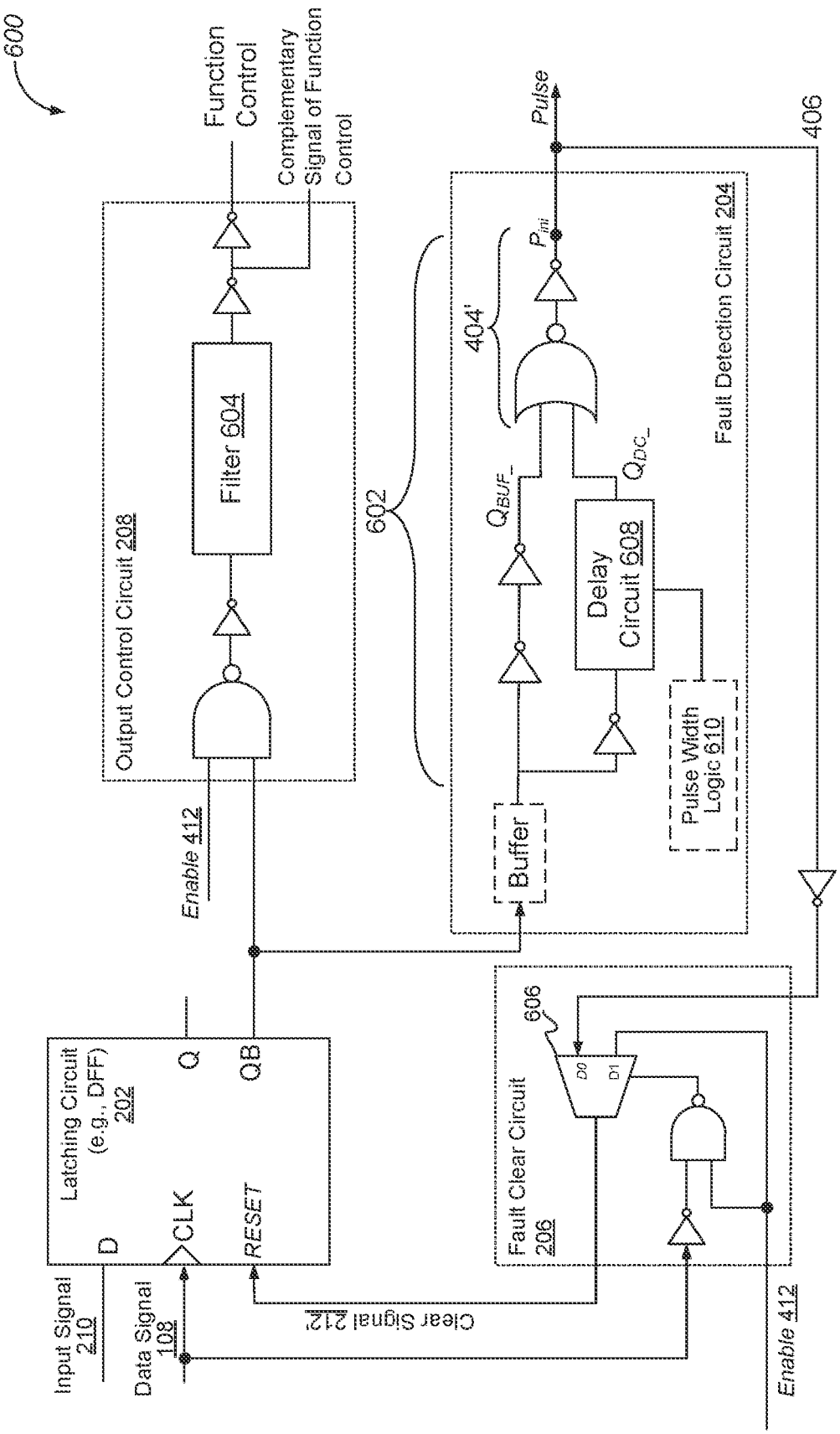
FIG. 6A is a block diagram of another example self-correcting control circuit in accordance with some embodiments, and FIG. 6B illustrate time diagrams of input/output and intermediate signals of the self-correcting control circuit shown in FIG. 6A in accordance with some embodiments.

FIG. 6A is a block diagram of another example self-correcting control circuit 600 in accordance with some embodiments, and FIG. 6B illustrate time diagrams 650 of input/output and intermediate signals of the self-correcting control circuit 600 shown in FIG. 6A in accordance with some embodiments. In some embodiments as shown in FIG. 4A, the output control circuit 208 bypasses the output Q of the latching circuit 202 when the output Q is associated with SEUs. Alternatively, in some embodiments as shown in FIG. 6A, the output control circuit 208 includes a filter 604 configured to suppress the glitches 436 and 438 of the output Q or QB of the latching circuit 202, which are associated with internal SEUs of the latching circuit 202. That said, the filter 604 includes a low-pass filter having a characteristic frequency $f_C$. The filter 604 is configured to suppress noise of the output Q or QB having a pulse width less than a characteristic pulse width $T_C$ corresponding to the characteristic frequency $f_C$. The glitches 436 and 438 have pulse widths less than the characteristic pulse width $T_C$, and therefore, are filtered from the output Q or QB of the latching circuit 202. In some implementations, the output Q or QB of the latching circuit 202 further includes alternative glitches and noise caused by noise sources other than the SEUs of the latching circuit 202. If the alternative glitches and noise correspond to noise frequencies less than the characteristic frequency $f_C$, the filter 604 eliminates the alternative glitches and noise from the output Q or QB of the latching circuit 202 in conjunction with the glitches 436 and 438.

In some implementations, the filter 604 is implemented as a delay buffer configured to delay the output Q or QB of the latching circuit 202. While providing a delay to the output Q or QB, the delay buffer automatically eliminates glitches (e.g., the glitches 436 and 438) having pulse widths less than a characteristic pulse width $T_C$. In some situations, the embodiments shown in FIG. 6A are preferred to the embodiments shown in FIG. 4A, e.g., due to the relatively simple structure of the output control circuit 208.

In some implementations, the fault clear circuit 206 includes a multiplexer 606. The multiplexer 606 is coupled to the global enable signal 412 and data signal 108, and configured to generate a clear signal 212' applied to reset the latching circuit 202. Specifically, when the global enable signal 412 is enabled and the data signal 108 is disabled, the clear signal 212' tracks the pulse signal 406 to enable resetting of the latching circuit 202 in response to detection of the SEUs in the output Q or QB of the latching circuit 202 (e.g., during pulses 442 and 444 of the clear signal 212').

In some implementations, the fault detection circuit 204 receives the complementary output QB of the latching circuit 202 and detects a falling edge of the complementary output QB. The fault detection circuit 204 optionally includes an NOR logic gate or an OR logic component 404'. The NOR logic gate or the OR logic component 404' combines a buffered complementary output $Q_{BUF\_}$ and a delayed inverted complementary output $Q_{DC\_}$ that are generated from the output Q of the latching circuit 202, thereby generating the pulse signal 406 including a single shot pulse corresponding to the falling edge of the complementary output QB. In some implementations, a pulse width logic 610 is coupled to a delay circuit 608, and controls the delay circuit 608 to generate an adjustable delay for the delayed inverted complementary output $Q_{DC\_}$. When the output $Q_{DC}$ is combined with the output $Q_{BUF\_}$ by the logic component 404', the resulting pulse signal 406 is generated with an adjustable pulse width $T_D$ that matches a duration of the glitch 436 or 438, SEU events or series of consecutive SEUs associated with the latching circuit 202. An example implementation of the pulse width logic 610 and the delay circuit 608 is described in detail with reference to FIGS. 9A and 9B.

FIG. 7A is a block diagram of another example fault detection circuit 204' in accordance with some embodiments, and FIG. 7B illustrates time diagrams 700 of signals in the fault detection circuit shown in FIG. 7A in accordance with some embodiments. In contrast, FIG. 7C illustrates time diagrams 720 of signals in the fault detection circuit 204 shown in FIG. 4A in accordance with some embodiments. Referring to FIGS. 4A and 7C, a buffered output $Q_{BUF}$ and a delayed inverted output $Q_{DC\_}$ are generated from the output Q of the latching circuit 202. The buffered output $Q_{BUF}$ has a buffer delay with respect to the output Q of the latching circuit 202, depending on how many buffer stages are applied. The output $Q_{DC\_}$ is inverted and has a first delay with respect to the output Q of the latching circuit 202, and the first delay is determined by the first delay circuit 408. The AND logic 404 is configured to combine the buffered output $Q_{BUF}$ and the delayed inverted output $Q_{DQ\_}$ to create a single pulse signal $P_{ulse}$ having a pulse width corresponding to First delay circuit 408 with rising edge of the output Q of the latching circuit 202.

In some embodiments, the pulse width logic 410 is applied at an output interface of the fault detection circuit 204 to increase a pulse width of the pulse of the initial pulse signal $P_{ini}$ and provide a pulse signal 406 that indicates the rising edge of the output Q of the latching circuit and has a predetermined pulse width of $T_D$.

Referring to FIGS. 7A and 7B, an inverted buffered output $Q_{BUF\_}$ and a delayed output $Q_{DC}$ are generated from the output Q of the latching circuit 202. The inverted buffered output $Q_{BUF\_}$ is inverted and has a buffer delay with respect to the output Q of the latching circuit 202. The delayed output $Q_{DC}$ has a first delay with respect to the output Q of the latching circuit 202, and the first delay is determined by the first delay circuit 408. The NOR logic 702 is configured to combine the inverted buffered output $Q_{BUF\_}$ and the delayed output $Q_{DC}$ to create an initial pulse signal $P_{ini}$ having a pulse corresponding to each rising edge of the output Q of the latching circuit 202. In some embodiments, the pulse width logic 410 is applied at an output interface of the fault detection circuit 204' to increase a pulse width of the pulse of the initial pulse signal, thereby providing a pulse signal 406 that indicates the rising edge of the output Q of the latching circuit and has a predetermined pulse width of $T_D$.

In some situations, the pulse width $T_D$ associated with the pulse signal 406 is configured to be greater than a duration of time for which the detected SEU lasts. In some situations, the detected SEU is a start of a series of SEUs (i.e., a train of SEUs) that closely follow each other, and the pulse width $T_D$ associated with the pulse signal 406 is programmed to be longer than a duration of time for which the series of SEUs last. In some embodiments, the pulse width $T_D$ is configured to be greater than a duration of a corresponding glitch 436 or 438. In some embodiments, durations of the glitches 436 and 438 are estimated for the latching circuit 202, and the pulse width logic 410 is configured (i.e., pre-programmed) to provide the pulse width $T_D$ based on the estimated durations of the glitches.

In some embodiments not shown in FIGS. 5-7, the first voltage level is higher than the second voltage level, and an SEU originates internally in the self-correcting control circuit 104 and causes glitches (e.g., voltage valleys) on the first voltage level at the output Q of the latching circuit 202. The fault detection circuit 204 includes a negative-edge pulse detector (e.g., 602 in FIG. 6) configured to detect each falling edge of the complementary output QB of the latching circuit 202. The negative-edge pulse detector 602 is implemented by replacing the AND logic 404 of the positive-edge pulse detector 402 with an NOR logic in FIG. 7A. Alternatively, the negative-edge pulse detector is implemented by replacing an OR logic 702 of the positive-edge pulse detector in the fault detection circuit 204' with an AND logic.

Figure 8A:
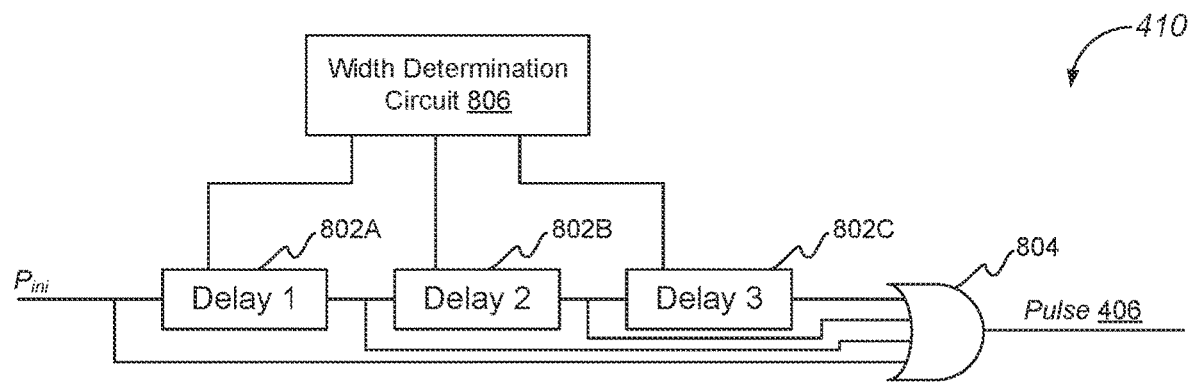
FIG. 8A is a block diagram of a delay and pulse width setting logic applied in a self-correcting control circuit in accordance with some embodiments.
Figure 8B:
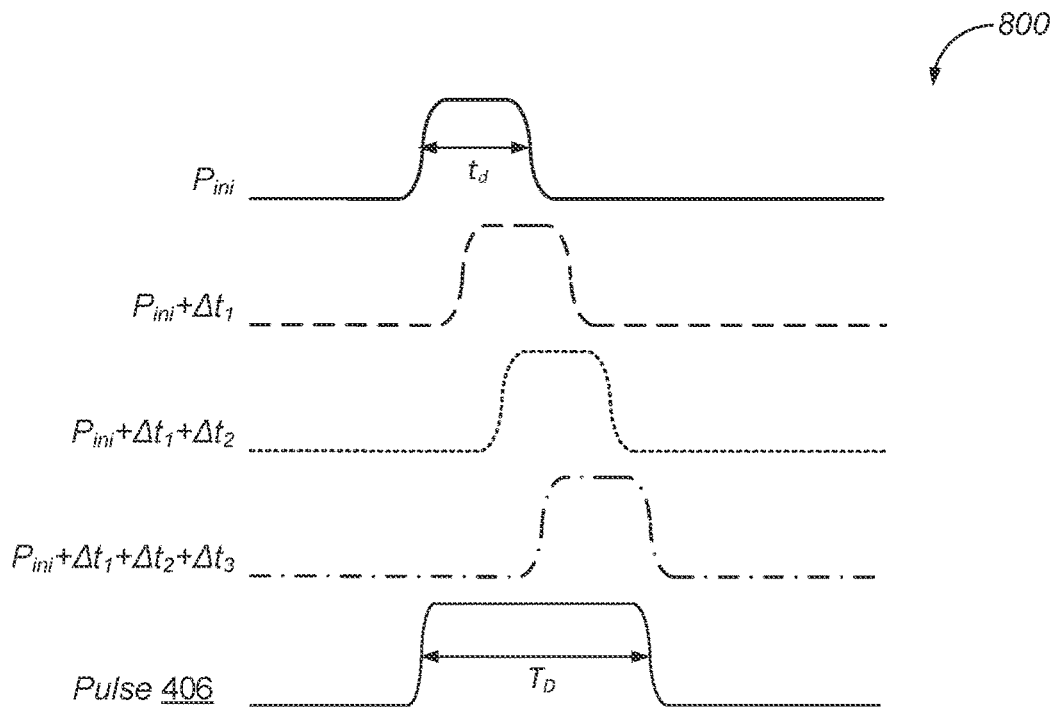
FIG. 8B illustrates time diagrams of input, output and intermediate nodes of the pulse width logic shown in FIG. 8A in accordance with some embodiments.

FIG. 8A is a block diagram of a pulse width logic 410 applied in a self-correcting control circuit 400 in accordance with some embodiments, and FIG. 8B illustrates time diagrams of input/output and intermediate nodes of the pulse width logic 410 shown in FIG. 8A in accordance with some embodiments. The pulse width logic 410 is coupled to receive an initial pulse signal $P_{ini}$ provided by the edge pulse detector 402, and has an initial pulse width $t_d$. The pulse width logic 410 includes one or more consecutive buffer stages 802, and each buffer stage 802A, 802B or 802C is configured to provide a respective delay time $\Delta t_i$ with respect to a respective input. Outputs of the consecutive buffer stages 802 are combined by an OR logic 804. A pulse width $T_D$ of the resulting pulse signal 406 is a sum of the initial pulse width $t_d$ of the initial pulse signal $P_{ini}$ and the delay times $\Delta t_i$ of the consecutive buffer stages. For example, in FIG. 8B, the pulse width $T_D$ is equal to $t_d + \Delta t_1 + \Delta t_2 + \Delta t_3$. In some embodiments, the pulse width logic 410 includes a width determination circuit 806 configured to determine the duration of the glitch 436 or 438, an SEU event or a series of consecutive SEUs, and determine the pulse width $T_D$ based on the determined duration. The pulse width logic 410 generates a plurality of delay controls to determine whether each of the one or more consecutive buffer stages 802 is bypassed, such that the sum of the initial pulse width $t_d$ and the delay times $\Delta t_i$ of the buffer stages that are not bypassed matches (e.g., is equal to or greater than) the determined duration of the glitch 436 or 438, an SEU event or a series of consecutive SEUs. By these means, the pulse width logic 410 is configured to control the pulse width $T_D$ to match the duration of the glitch 436 or 438, the SEU event or the series of consecutive SEUs.

In some embodiments, the pulse width logic 416 is also implemented according to FIG. 8A. The pulse width logic 416 includes one or more consecutive buffer stages, and each buffer stage 802A, 802B or 802C is configured to provide a respective delay time $\Delta t_i$ with respect to a respective input, such that a sum of a pulse width $T_D$ of the clear signal 212 and the delay times $\Delta t_i$ of the consecutive buffer stages is greater than glitch widths of glitches (e.g., glitches 502 or 504) of the delayed latch output Q' (see FIG. 5). That said, the pulse width is thereby adjusted and programmed according to a width of a possible transient upset (i.e., an SEU or a series of SEUs) originating from the latching circuit, such that the pulse width exceeds the width of the possible transient upset of the latching circuit 202.

In some embodiments, the fault detection circuit 204 does not include a separate pulse width logic 410 for adjusting the pulse width of the pulse signal 406. Rather, the pulse width of the pulse signal 406 is defined by the first delay circuit 408, i.e., the first delay circuit 408 is configured to have an adjustable delay, thereby causing the pulse width of the pulse signal 406 to be adjustable. FIG. 9A is a block diagram of an adjustable delay circuit 900 in accordance with some embodiments. The adjustable delay circuit 900 is used in the first delay circuit 408 for generating pulses having a predetermined pulse width in a self-correcting control circuit 400. In some embodiments, the adjustable delay circuit 900 is used in the second delay circuit 414 in FIG. 4A or the filter 604 in FIG. 6A in the output control circuit 208 to delay the output Q or QB of the latching circuit by a predetermined delay time. The predetermined delay time is configured to allow the fault detection circuit 204 and fault clear circuit 206 to detect and deter a SEU.

Figure 9B:
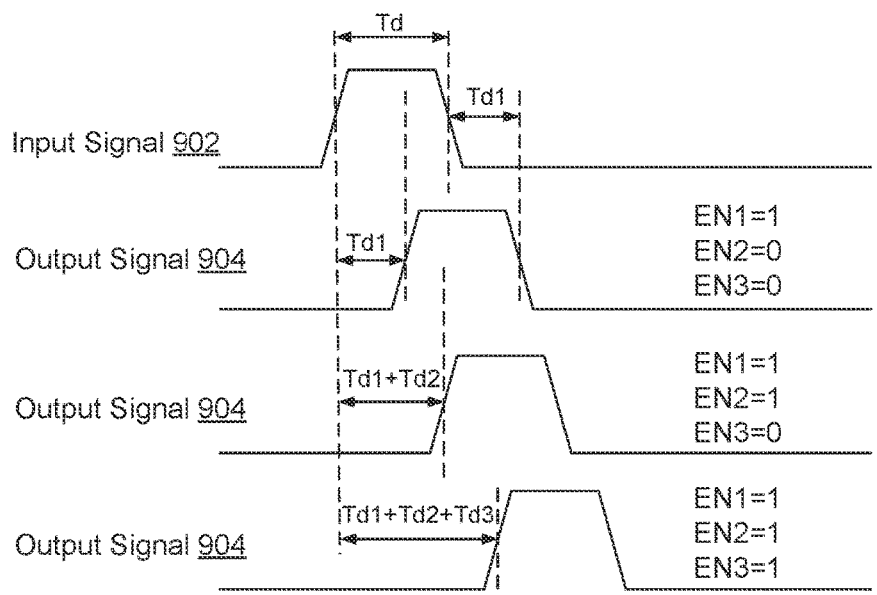
FIG. 9B illustrates time diagrams of input and output signals of an adjustable delay circuit shown in FIG. 9A in accordance with some embodiments.

FIG. 9B illustrates time diagrams of input and output signals of an adjustable delay circuit 900 shown in FIG. 9A in accordance with some embodiments. When the adjustable delay circuit 900 is used in the first and second delay circuits 408 and 414, a pulse width of a pulse signal 406 and a delay time of the output Q can be set by one of a plurality of predetermined options (e.g., Td1, Td1+Td2, and Td1+Td2+Td3). In this example shown in FIG. 9A, there are 3 delay elements that can adjust a total delay of an output signal 904 with reference to an input signal 902. Delay elements 906A, 906B and 906C are enabled through switches controlled by a first control EN, a second control EN_2 and a third control EN3, respectively. The output signal 904 is buffered (e.g., using a buffer 908) to generate the predetermined delay time with respect to the input signal 902. Optionally, the controls EN1, EN2 and EN3 are controlled by a digital core circuit. Optionally, a delay selection circuit 910 is configured to electrically couple each of the controls EN1, EN2 and EN3 to VDD for enabling the respective delay element 906 or to GND for disabling the respective delay element 906.

In some embodiments, the adjustable delay circuit 900 is applied in the fault detection circuit 204 in FIG. 4A or 6A to generate a pulse signal 406 having an adjustable (i.e., programmable) pulse width. For example, the pulse width logic 610 and delay circuit 608 are implemented by the delay selection circuit 910 and the delay elements 906A-906C in FIG. 6A, respectively.

Figure 9C:
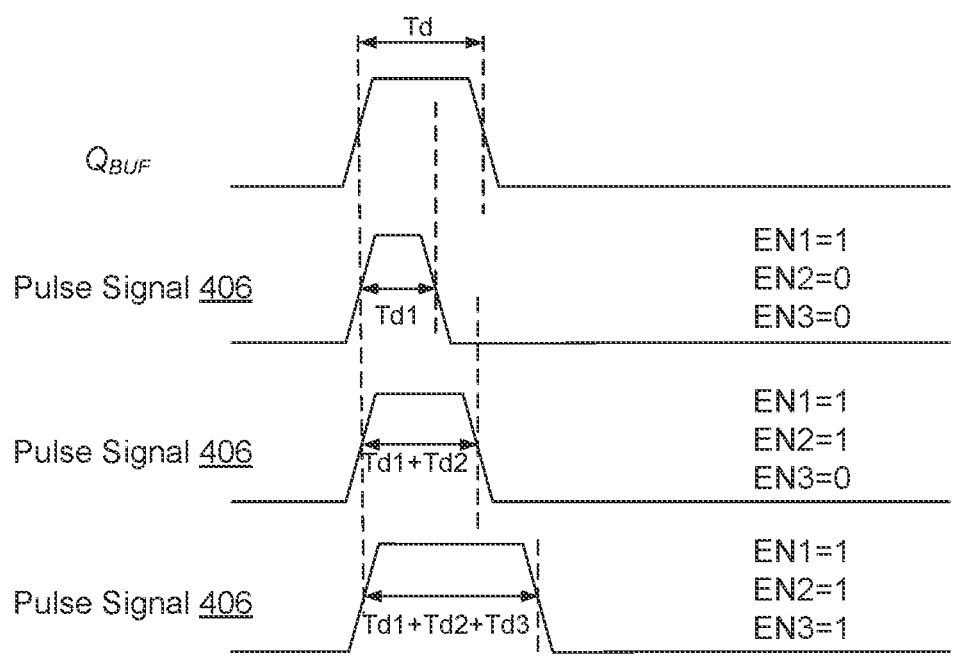
FIG. 9C illustrates timing diagram of a pulse signal generated based on an output signal provided by the adjustable delay circuit in accordance with some embodiments.
Figure 10A:
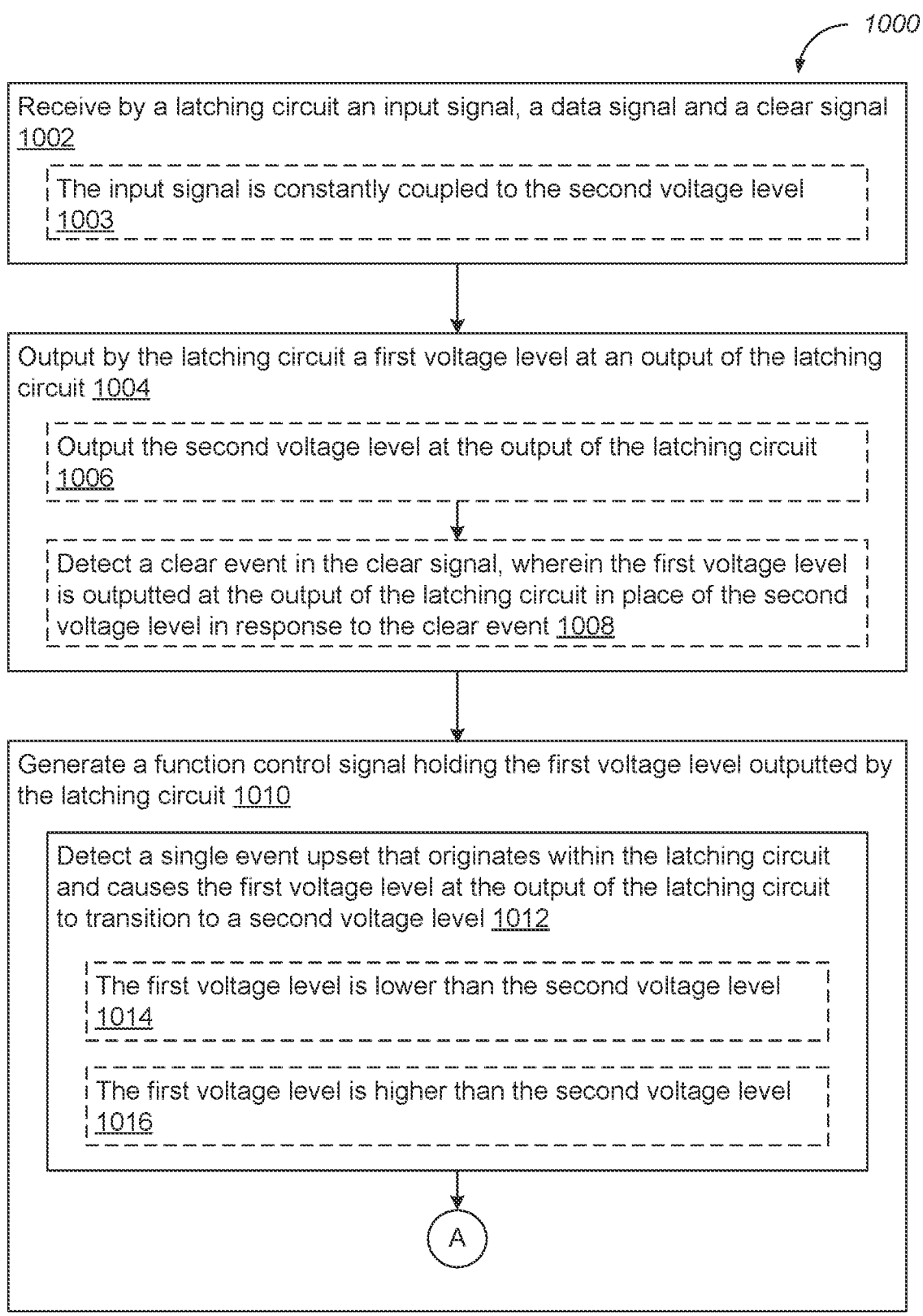

FIG. 9C illustrates a timing diagram of a pulse signal 406 generated based on an output signal provided by the adjustable delay circuit 900 in accordance with some embodiments. When only the first delay element 906A is enabled, the pulse width $T_D$ of the pulse signal 406 is equal to Td1. The maximum pulse width of the pulse signal 406 (i.e., Td1+Td2+Td3) is obtained when the delay elements 906A, 906B and 906C are enabled. In an example, the latching circuit 202 is determined to be associated with glitches caused by SEUs, and the glitches have widths less than Td1+Td2. Pulse widths $T_D$ of the clear Signal 212 are greater than the widths of the SEU-related glitches, e.g., at least equal to Td1+Td2. The fault detection circuit 204 provides the clear signal 212 having a HLH (high low high pulse) signal pattern to an input of the latching circuit 202, and the pulse width $T_D$ of the clear signal is thereby adjusted and programmed according to a width of a possible transient upset (i.e., an SEU or a series of SEUs) originating from the latching circuit, such that the pulse width exceeds the width of the possible transient upset of the latching circuit 202. In some embodiments, the pulse width $T_D$ is not dynamically determined. The pulse width $T_D$ is predetermined based on characteristics of the possible transient upset originating from the latching circuit. The fault detection circuit 204 is thereby pre-programmed to generate the pulse signal 406 having the predetermined pulse width $T_D$.

FIGS. 10A-10D illustrate a representative flow chart of a method 1000 for suppressing a fault (e.g., a single event upset) in an integrated circuit in accordance with some embodiments. The fault suppression method 1000 is implemented by a self-correcting control circuit (e.g., the circuit 104 in FIG. 2 and the circuit 400 in FIG. 4A) having a latching circuit 202. The latching circuit 202 receives (1002) an input signal 210, a data signal 108 and a clear signal 212. During normal operation, the latching circuit 202 is configured to sample the input signal 210 under the control of the data signal 108 (e.g., at a rising edge, a failing edge or a predetermined voltage level of the data signal 108), and to hold a sampled voltage level of the input signal 210 until the input signal 210 is resampled or until the latching circuit 202 is reset by the clear signal 212. In some embodiments, the input signal 210 is constantly coupled to (1003) a second voltage level. For example, the second voltage level corresponds to a logic level of "1" that indicates that an abnormal event has occurred.

The latching circuit 202 outputs (1004) a first voltage level at an output Q of the latching circuit 202 and outputs a second voltage level (complementary of output Q) at its QB output. In some embodiments, prior to outputting the first voltage level, the latching circuit 202 initially outputs (1006) the second voltage level at the output Q of the latching circuit 202. When a clear event is detected on the clear signal 212, the first voltage level is outputted (1008) at the output Q of the latching circuit 202 in place of the second voltage level. A function control signal is generated by the self-correcting control circuit 400 to hold (1010) the first voltage level outputted by the latching circuit 202.

When the first voltage level is held at the function control signal, a single event upset is detected (1012) by a fault detection circuit 204 coupled to the latching circuit 202. The single event upset originates within the latching circuit 202 and causes the first voltage level at the output Q of the latching circuit 202 to transition to the second voltage level. In some embodiments, the first voltage level is (1014) lower than the second voltage level, and the first and second voltage levels correspond to the logic levels of "0" and "1," respectively. Alternatively, in some embodiments, the first voltage level is (1016) higher than the second voltage level, and the first and second voltage levels correspond to the logic levels of "1" and "0," respectively.

The fault detection circuit 204 is further coupled to a fault clear circuit 206. In response to detection of the single event upset, the fault clear circuit 206 controls (1018) the latching circuit 202 via the clear signal 212 to reset the output Q of the latching circuit to the first voltage level. A glitch 436 or 438 is formed on the first voltage level at the output Q of the latching circuit 202 in response to the single event upset. In some situations, the output Q of the latching circuit 202 stays at the second voltage level after the single event update terminates, and the clear signal 212 resets the output Q to the first voltage level. Alternatively, in some situations, the output Q of the latching circuit 202 overshoots to or beyond the second voltage level, and returns to the first voltage level as the single event update terminates. The clear signal 212 is not required for resetting the output Q to the first voltage level, and however, the fault clear circuit 206 still controls the latching circuit 202 via the clear signal 212 to reset the output Q of the latching circuit 202 to the first voltage level again.

Specifically, in some embodiments, the clear signal 212 includes (1020) a pulse corresponding to the single event upset and the glitch on the first voltage level held at the output Q of the latching circuit 202. The pulse of the clear signal has a pulse width $T_D$ configured to be greater than a duration (e.g., $T_{Glitch1}$ and $T_{Glitch2}$ in FIGS. 4B and 6B) of the glitch. In some situations, the pulse width of the clear signal 212 is adjusted and programmed according to a width of a possible transient upset (e.g., the detected SEU or a series of SEUs started with the detected SEU) originating from the latching circuit 202, such that the pulse width exceeds the width of the possible transient upset of the latching circuit. Durations of glitch pulses associated with the latching circuit are estimated for the purposes of estimating (1022) the duration of the glitch. The pulse width $T_D$ is determined (1024) based on the estimated duration of the glitch (i.e., the estimated durations of glitch pulses associated with the latching circuit, and the fault detection circuit 204 is programmed to enable the pulse width $T_D$ of the clear signal 212. More specifically, the fault detection circuit 204 will respond to SEU fault what data signal is at logic level low "0". Fault detection circuit will not clear the RESET input of latching circuit when data signal is at high level "1" i.e. when data signal transitions from logic low level "0" to logic high level "1" the latching must not be cleared to prevent circuits further down the stream controlled by function control output.

The output Q of the latching circuit 202 is further coupled to an output control circuit 208 that outputs the function control signal. The output control circuit 208 suppresses (1026) the glitch at the output Q of the latching circuit 202 to generate the function control signal holding the first voltage level without the glitch. In some embodiments the delay of the Second Delay Circuit 414 can be made shorter if the internal glitch pulse width in latching circuit is short. It is noted that the pulse of the clear signal 212 broadly corresponds to a pulse of logic level of "1" on a baseline of "0" and a pulse of logic level of "0" on a baseline of "1." In accordance with a determination of operating within the pulse of the clear signal 212, the output control circuit 208 selects (1030) the first voltage level to be outputted to the function control signal, thereby bypassing the delayed output Q that contains the glitch from being outputted. In accordance with a determination of operating outside the pulse of the clear signal 212, the output control circuit 208 selects (1032) the delayed output of the latching circuit to be outputted via the function control signal. It is noted that when the pulse of the clear signal 212 corresponds to a pulse on the clear signal 212, the corresponding pulse width corresponds to a width of the pulse on the clear signal 212.

In some embodiments, referring to FIG. 1, the function control signal is applied to control (1034) a core function. Optionally, the core function is controlled by the function control signal or its complementary signal. When the function control signal holds the first voltage level, a core monitoring circuit 106 monitors (1036) an electrical characteristic (e.g., a drive current) associated with the core function, detects (1038) an abnormal event based on the electrical characteristic associated with the core function, and outputs (1040) the data signal 108 including a trigger event associated with the abnormal event. In response to the trigger event of the data signal, the latching circuit is refreshed (1042) to latch a voltage level of the input signal 210 at the output Q of the latching circuit. Thus, the abnormal event results (1044) in transitions of the output Q of the latching circuit 202 and the function control signal, e.g., from the first voltage level to the second voltage level at the transition 440 in FIG. 4B, thereby disabling the core function.

In some embodiments, while the function control signal holds the first voltage level, a trigger event (e.g., 440 in FIG. 4B) is detected (1046) in the data signal received by the latching circuit 202. In response to detection of the trigger event in the data signal (1048), the latching circuit 202 is controlled to sample (1050) the input signal at a first time, and the function control signal is refreshed (1052) to hold the second voltage level corresponding to the input signal sampled at the first time. Further, in some embodiments, the trigger event corresponds to a first edge (e.g., 440 in FIG. 4B) of the data signal. Referring to FIG. 4B, after the trigger event, the second voltage level is held (1054) at the output Q of the latching circuit 202 until a clear event is detected in the clear signal or until a second edge is detected in the data signal subsequent to the first edge. Further, in some embodiments, the first and second edges are (1056) both rising edges of the data signal 108. In some embodiments, the first and second edges are (1056) both falling edges of the data signal 108. Alternatively, in some embodiments, one of the first and second edges is (1058) a falling edge of the data signal 108, and the other of the first and second edges is a rising edge of the data signal 108. In contrast, in some embodiments, the trigger event corresponds to (1060) the data signal 108 being biased at the second voltage level. The input signal 210 is tracked by the output Q of the latching circuit 202 while the data signal is biased at the second voltage level.

In some embodiments, the latching circuit 202 includes a D-type flip flop (DFF). In accordance with the fault suppression method 1000, a DFF receives an input signal 210, a data signal 108 and a clear signal 212 and outputs a first voltage level at an output of the DFF. A function control signal is generated to hold the first voltage level outputted by the DFF. Specifically, a single event upset is detected. The single event upset originates within the DFF and causes the first voltage level at the output of the DFF to transition to a second voltage level. In response to detection of the single event upset, the DFF is controlled via the clear signal to reset the output of the DFF to the first voltage level. A glitch is formed on the first voltage level at the output of the DFF in response to the single event upset. The glitch is suppressed at the output of the DFF to generate the function control signal holding the first voltage level without the glitch.

In accordance with some implementations of the application, a method is implemented to provide a self-correcting control circuit 104. The method includes providing a latching circuit 202 configured to receive an input signal 210, a data signal 108 and a clear signal 212 and be controlled by the data signal to hold a first voltage level at an output Q. The method further includes providing a fault detection circuit 204 coupled to the latching circuit 202. The fault detection circuit 204 is configured to detect a single event upset that originates within the latching circuit 202 and causes the first voltage level at the output Q of the latching circuit 202 to transition to a second voltage level. The method further includes providing a fault clear circuit 206 coupled between the fault detection circuit 204 and the latching circuit 202. The fault clear circuit 206 is configured to generate the clear signal 212 in response to detection of the single event upset and control the latching circuit 202 to reset the output Q of the latching circuit 202 to the first voltage level. A glitch is formed on the first voltage level at the output Q of the latching circuit 202 in response to the single event upset. The method further includes providing an output control circuit 208 coupled to the latching circuit 202. The output control circuit 208 is configured to suppress the glitch at the output Q of the latching circuit 202 and generate a function control signal holding the first voltage level without the glitch.

It is noted that the fault suppression method 1000 relies on a feedback to suppress glitches on the output of the latching circuit 202 without duplicating the latching circuit 202 or periodically refreshing/resetting the latching circuit 202 via the data signal 108. Application of this feedback conserves chip space and/or power consumption associated with the alternative approaches. As a power supply rail is reduced, the latching circuit 202 is more susceptible to the single event upset. The fault suppression method 1000 can conveniently address this issue and enhance robustness of the latching circuit 202 at a low power supply rail. Particularly, a DFF having a clear signal can utilize the fault suppression method 1000 to operate at low or moderate frequencies when the power supply rail is low in many synchronous and asynchronous applications. For example, if a corresponding feedback in the self-correcting control circuit 104 introduces 20 nanoseconds, the self-correcting control circuit 104 at least operates at a frequency below 25 MHz.

It will be understood that, although the terms "first," "second," etc. may be used herein to describe various elements, these elements should not be limited by these terms. These terms are only used to distinguish one element from another. For example, a first signal could be termed a second signal, and, similarly, a second signal could be termed a first signal, which changing the meaning of the description, so long as all occurrences of the "first signal" are renamed consistently and all occurrences of the second signal are renamed consistently. The first signal and the second signal are both signals, but they are not the same signal.

Implementations described with respect to each individual circuit in FIGS. 1, 2, 4A, 6A, 7A, 8A and 9A are merely examples. Two or more individual circuits (e.g., the fault detection circuit 204 and the fault clear circuit 206) may be implemented in one circuit block. A logic implemented in one of the circuits can be implemented in another circuit. For example, the pulse width logic 410 may be implemented in the fault clear circuit 206 rather than in the fault detection circuit 204.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A fault suppression method, comprising:
   receiving by a first circuit a clear signal;
   outputting by the first circuit a first voltage level at an output of the first circuit; and
   generating a function control signal holding the first voltage level outputted by the first circuit, including:
      detecting a single event upset that originates within the first circuit and causes the first voltage level at the output of the first circuit to transition to a second voltage level;
      in response to detection of the single event upset, controlling the first circuit via the clear signal to reset the output of the first circuit to the first voltage level; and
      generating the function control signal holding the first voltage level.

2. The method of claim 1, further comprising:
   outputting the second voltage level at the output of the first circuit; and
   detecting a clear event in the clear signal, wherein the first voltage level is outputted at the output of the first circuit in place of the second voltage level in response to the clear event.

3. The method of claim 1, further comprising:
   receiving by the first circuit an input signal and a data signal;
   detecting a trigger event in the data signal received by the first circuit; and
   in response to detection of the trigger event in the data signal:
      controlling the first circuit to sample the input signal at a first time; and
      refreshing the function control signal to hold the second voltage level corresponding to the input signal sampled at the first time.

4. The method of claim 3, wherein the trigger event corresponds to a first edge of the data signal, the method further comprising:
   holding the second voltage level at the output of the first circuit until detecting a clear event in the clear signal or until detecting a second edge in the data signal subsequent to the first edge.

5. The method of claim 4, wherein the first and second edges are rising edges of the data signal.

6. The method of claim 4, wherein one of the first and second edges is a falling edged of the data signal, and the other of the first and second edges is a rising edge of the data signal.

7. The method of claim 3, wherein the trigger event corresponds to the data signal being biased at the second voltage level, the method further comprising:
   tracking the input signal at the output of the first circuit while the data signal is biased at the second voltage level.

8. The method of claim 1, further comprising:
   receiving by the first circuit an input signal and a data signal; and
   controlling a core function according to the function control signal, including:
      when the function control signal holds the first voltage level, monitoring an electrical characteristic associated with the core function;
      detecting an abnormal event based on the electrical characteristic associated with the core function;
      outputting the data signal including a trigger event associated with the abnormal event;
      in response to the trigger event of the data signal, refreshing the first circuit to latch a voltage level of the input signal at the output of the first circuit; and
      refreshing the function control signal based on the output of the first circuit.

9. The method of claim 1, wherein the first voltage level is lower than the second voltage level.

10. The method of claim 1, further comprising receiving by the first circuit an input signal, wherein the input signal is constantly coupled to the second voltage level.

11. The method of claim 1, wherein a fault is formed on the first voltage level at the output of the first circuit in response to the single event upset, and the fault is suppressed at the output of the first circuit.

12. The method of claim 11, wherein:
the clear signal includes a pulse corresponding to the single event upset and the fault on the first voltage level held at the output of the first circuit; and
the pulse of the clear signal has a pulse width configured to be greater than an duration of the fault.

13. The method of claim 12, the fault including one or more pulses, further comprising:
estimating durations of the one or more fault pulses associated with the first circuit; and
programming the pulse width of the pulse of the clear signal based on the estimated durations.

14. The method of claim 12, further comprising, while delaying the output of the first circuit for outputting via the function control signal:
in accordance with a determination of operating within the pulse of the clear signal, selecting the first voltage level to be outputted to the function control signal; and
in accordance with a determination of operating outside the pulse of the clear signal, selecting the delayed output of the first circuit to be outputted via the function control signal.

15. An electronic device, comprising:
a first circuit configured to receive a clear signal and hold a first voltage level at an output;
a fault detection circuit coupled to the first circuit, the fault detection circuit being configured to detect a single event upset that originates within the first circuit and causes the first voltage level at the output of the first circuit to transition to a second voltage level;
a fault clear circuit coupled between the fault detection circuit and the first circuit, the fault clear circuit being configured to generate the clear signal in response to detection of the single event upset and control the first circuit to reset the output of the first circuit to the first voltage level; and
an output control circuit coupled to the first circuit, the output control circuit being configured to generate a function control signal holding the first voltage level.

16. The electronic device of claim 15, wherein the output control circuit further includes a filter configured to filter out noise in the output of the first circuit.

17. The electronic device of claim 15, wherein the first circuit includes at least one of a latching circuit and a D-type flip flop (DFF).

18. The electronic device of claim 15, wherein a fault is formed on the first voltage level at the output of the first circuit in response to the single event upset, and the fault is suppressed at the output of the first circuit.

19. The electronic device of claim 15, wherein:
the first circuit is configured to receive an input signal and a data signal;
the fault detection circuit is configured to detect a trigger event in the data signal received by the first circuit; and
the fault clear circuit is configured to, in response to detection of the trigger event in the data signal:
control the first circuit to sample the input signal at a first time; and
refresh the function control signal to hold the second voltage level corresponding to the input signal sampled at the first time.

20. A fault suppression method, comprising:
receiving by a latching circuit a clear signal;
outputting by the latching circuit a first voltage level at an output of the latching circuit; and
generating a function control signal holding the first voltage level outputted by the latching circuit, including:
detecting a single event upset that originates within the latching circuit and causes the first voltage level at the output of the latching circuit to transition to a second voltage level;
in response to detection of the single event upset, controlling the latching circuit via the clear signal to reset the output of the latching circuit to the first voltage level; and
generating the function control signal holding the first voltage level.

* * * * *